United States Patent
Arai et al.

(10) Patent No.: US 7,122,866 B2
(45) Date of Patent: Oct. 17, 2006

(54) SEMICONDUCTOR MEMORY DEVICE WITH A STACKED GATE INCLUDING A FLOATING GATE AND A CONTROL GATE AND METHOD OF MANUFACTURING THE SAME

(75) Inventors: Fumitaka Arai, Yokohama (JP); Yasuhiko Matsunaga, Kawasaki (JP); Makoto Sakuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/061,824

(22) Filed: Feb. 18, 2005

(65) Prior Publication Data

US 2005/0224893 A1     Oct. 13, 2005

(30) Foreign Application Priority Data

Mar. 19, 2004   (JP) .............................. 2004-080809

(51) Int. Cl.
*H01L 29/94* (2006.01)
(52) U.S. Cl. ...................... 257/370; 257/391; 257/315; 257/317; 257/510; 257/501; 257/506; 257/365
(58) Field of Classification Search ................. None
See application file for complete search history.

(56) References Cited

U.S. PATENT DOCUMENTS

| 6,222,225 | B1 | 4/2001 | Nakamura et al. | |
|---|---|---|---|---|
| 6,342,715 | B1* | 1/2002 | Shimizu et al. | 257/314 |
| 6,639,296 | B1* | 10/2003 | Koido et al. | 257/510 |
| 6,680,230 | B1 | 1/2004 | Arai et al. | |
| 6,828,627 | B1* | 12/2004 | Goda et al. | 257/333 |
| 6,828,648 | B1* | 12/2004 | Koido et al. | 257/510 |
| 7,038,291 | B1* | 5/2006 | Goda et al. | 257/510 |
| 2004/0099900 | A1* | 5/2004 | Iguchi et al. | 257/315 |

OTHER PUBLICATIONS

W.-H. Liu et al., "*A 2-Transistor Source-select (2TS) Flash EEPROM for 1.8V-Only Applications*," Non-Volatile Semiconductor Memory Workshop 4.1, 1997, pp. 1-3.

\* cited by examiner

*Primary Examiner*—Nathan Flynn
*Assistant Examiner*—Fazli Erdem
(74) *Attorney, Agent, or Firm*—Frommer Lawrence & Haug LLP

(57) ABSTRACT

A semiconductor memory device includes first and second MOS transistors. The first MOS transistor is formed on a region enclosed by a first element isolating region and includes a first gate insulating film and a first gate electrode. The second MOS transistor is formed on a region enclosed by a second element isolating region and includes a second gate insulating film and a second gate electrode. The upper part of the first and second element isolating regions project from a semiconductor substrate and their corners are curved. The width from the position where the first element isolating region contacts the first gate insulating film to the top surface end of the first element isolating region is equal to the width from the position where the second element isolating region contacts the second gate insulating film to the top surface end of the second element isolating region.

13 Claims, 30 Drawing Sheets

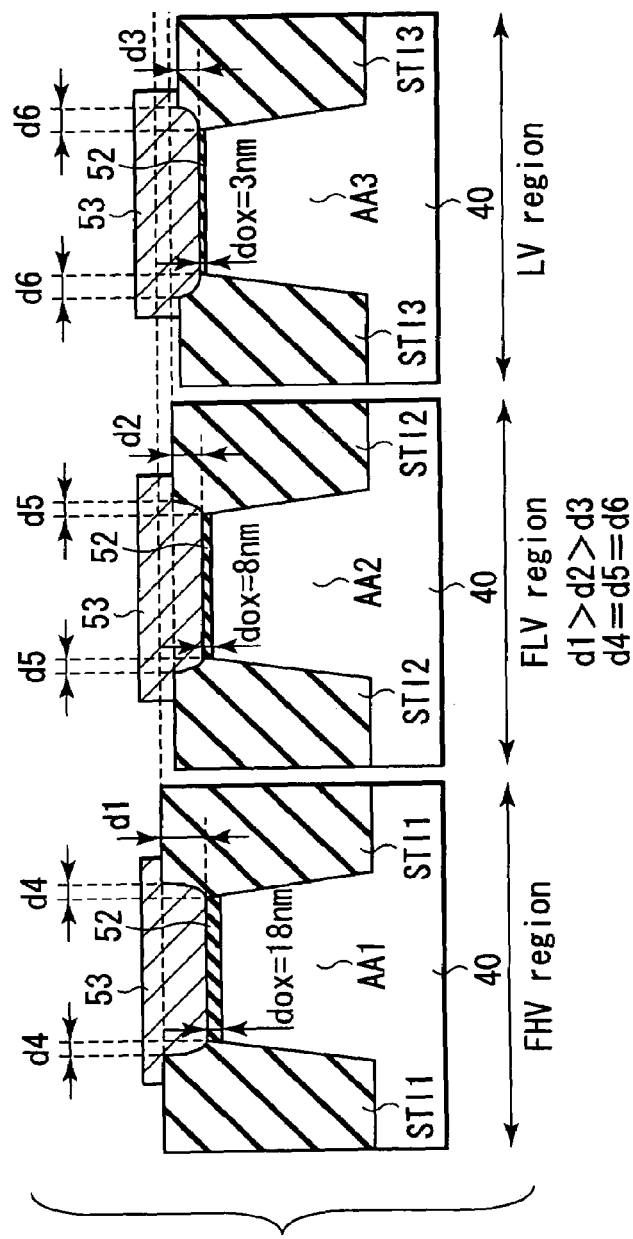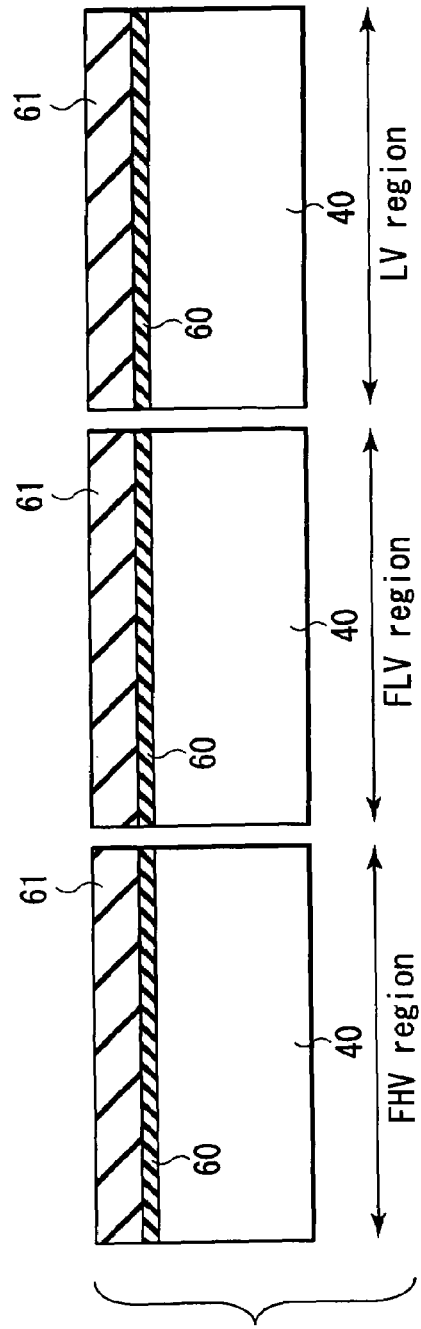

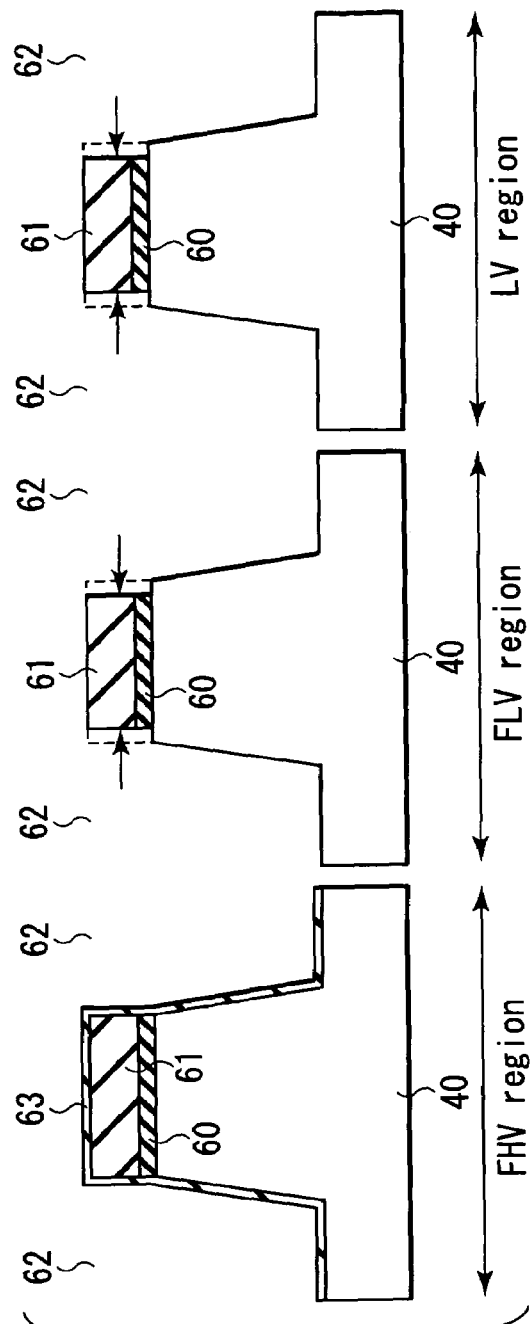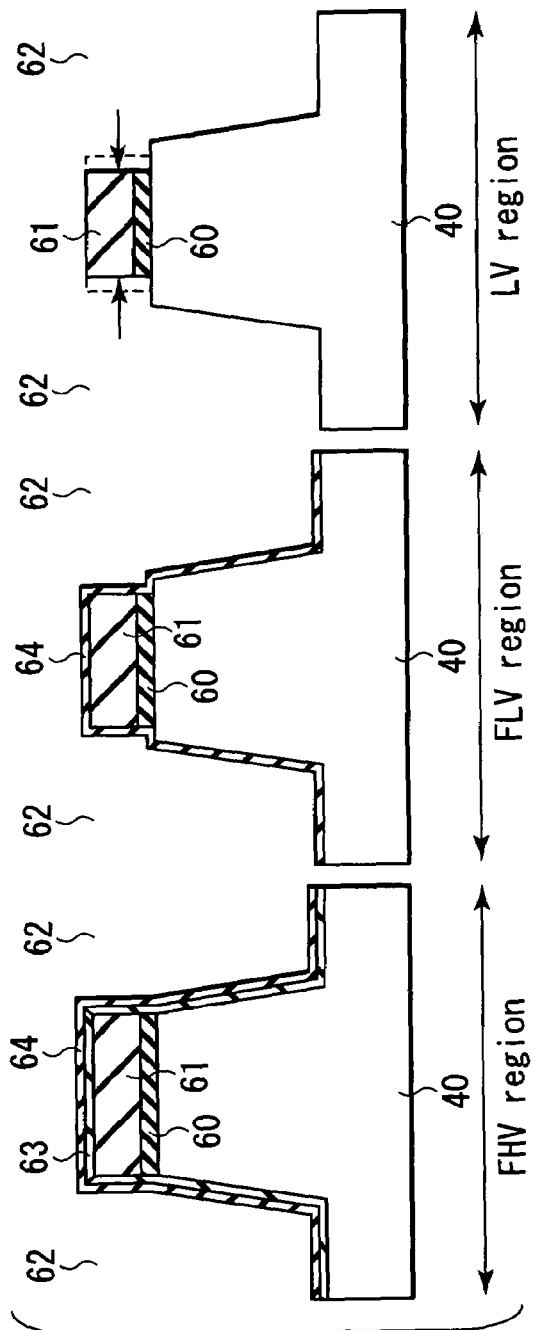

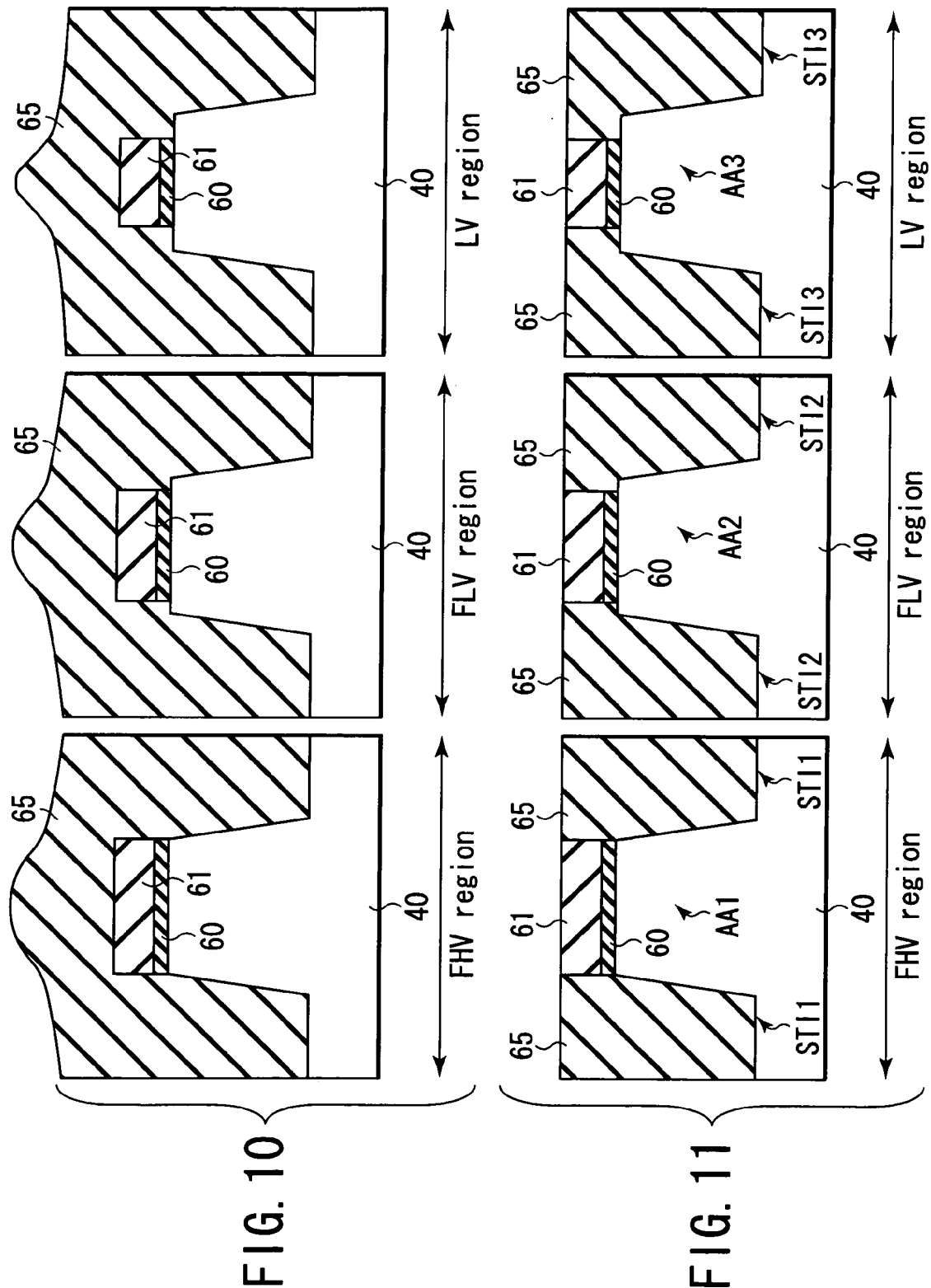

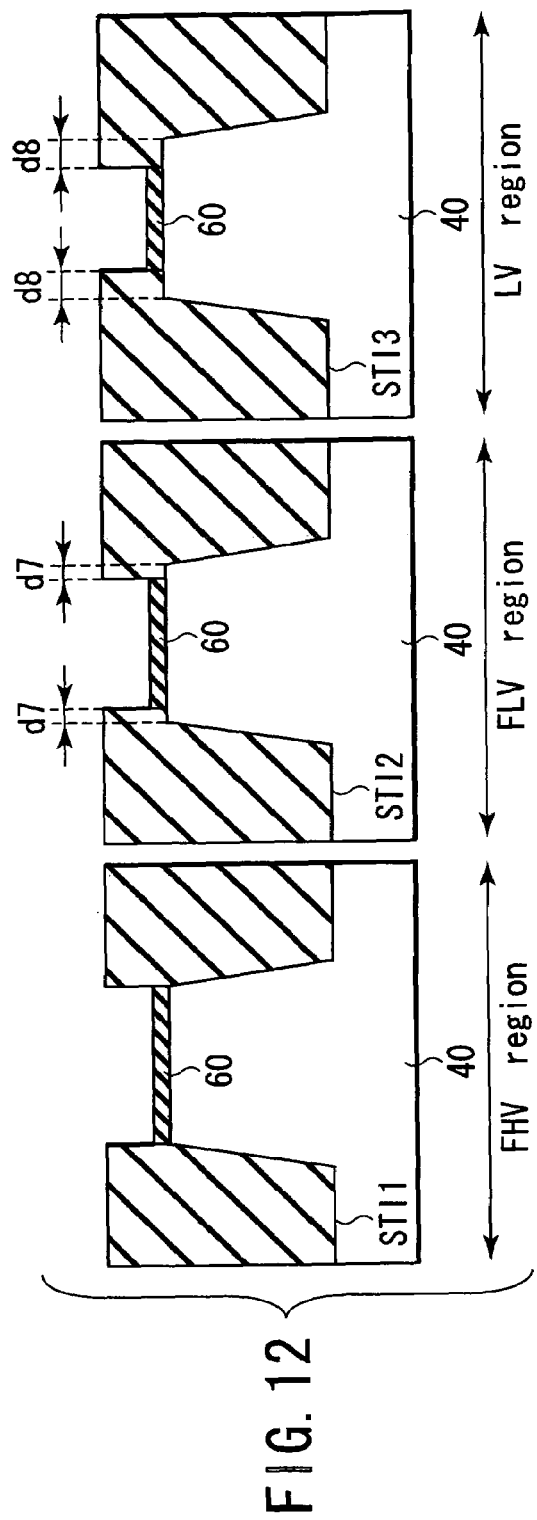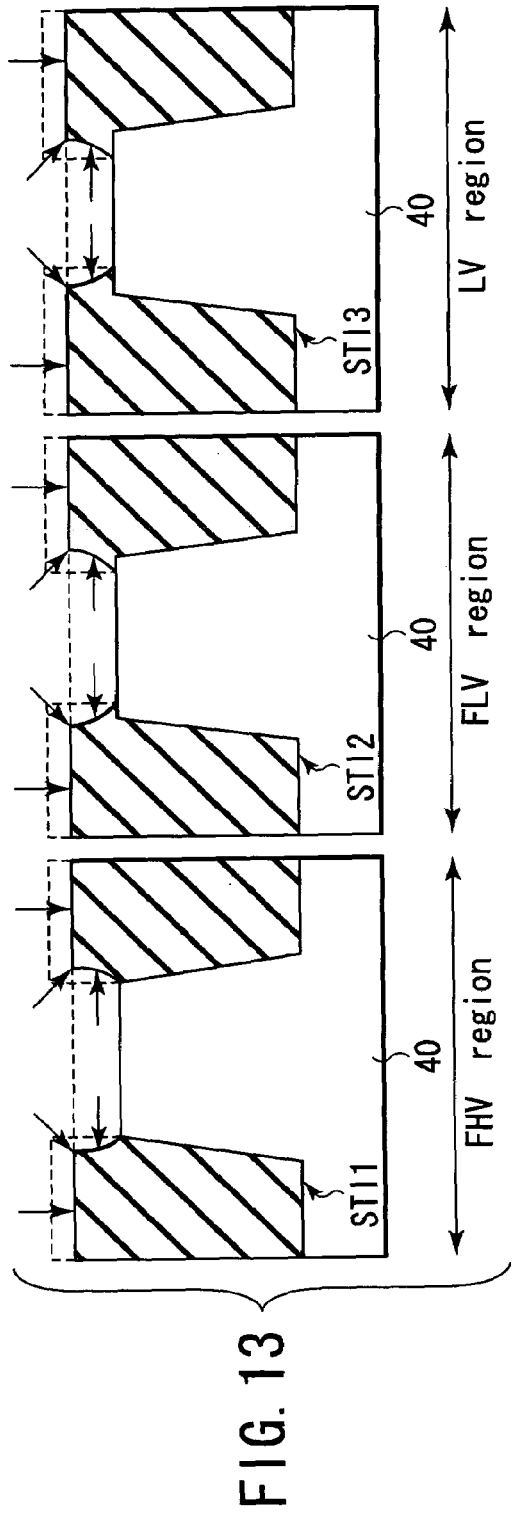

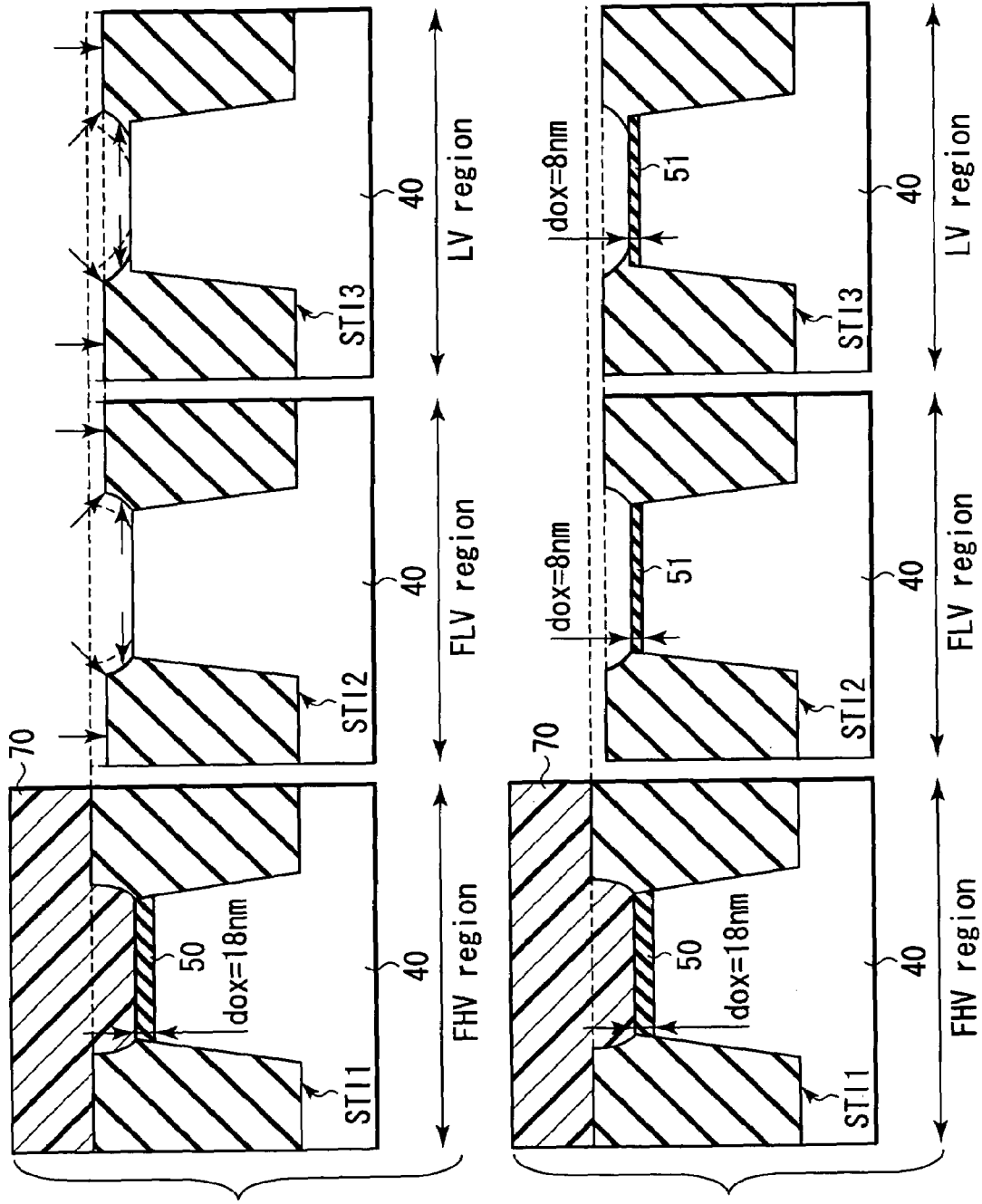

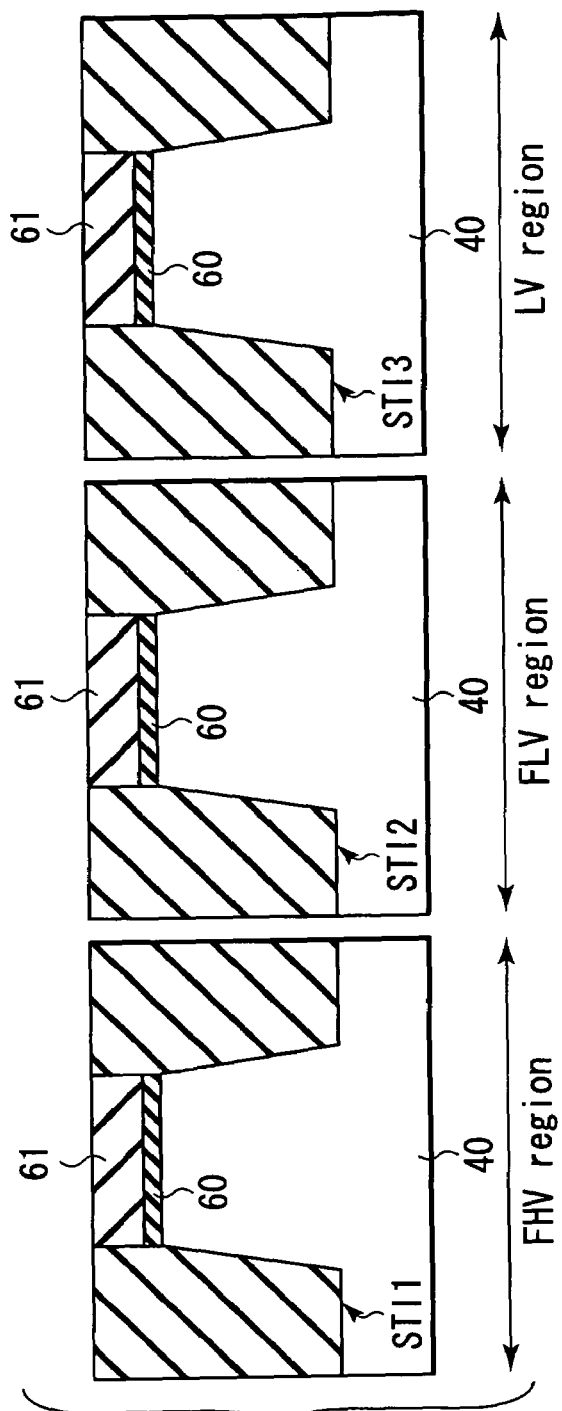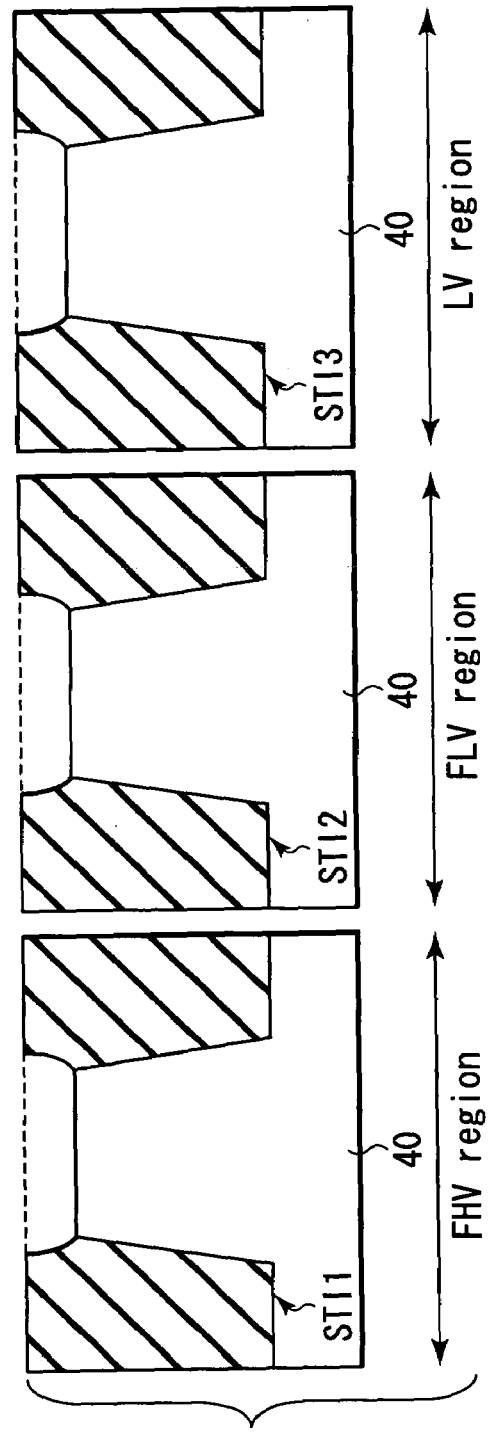
FIG. 22
FIG. 23

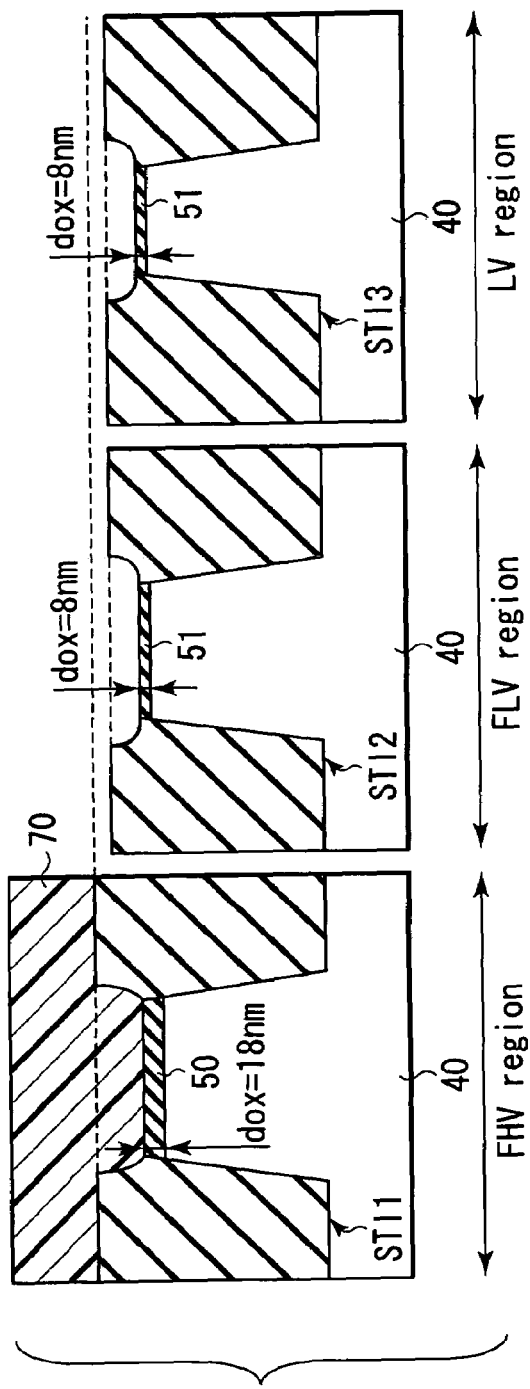
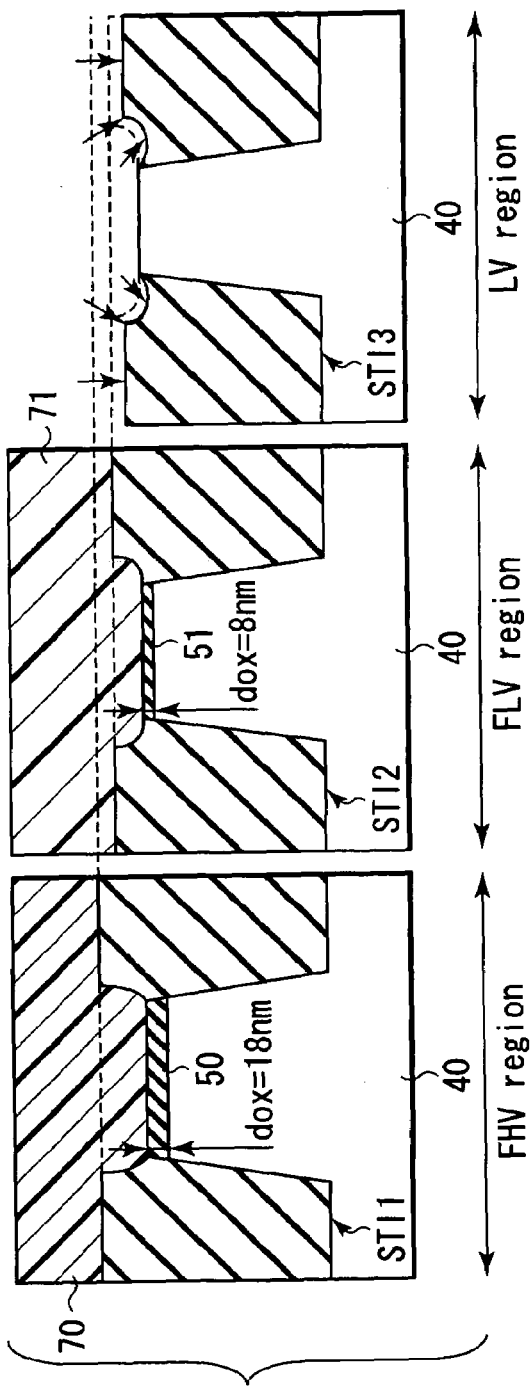
FIG. 26
FIG. 27

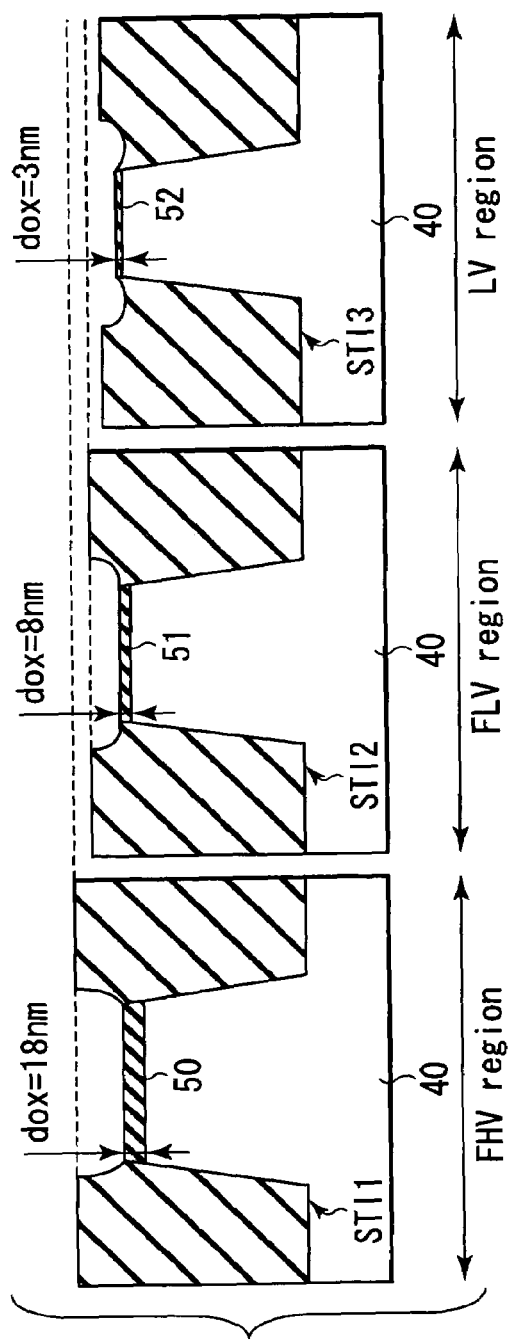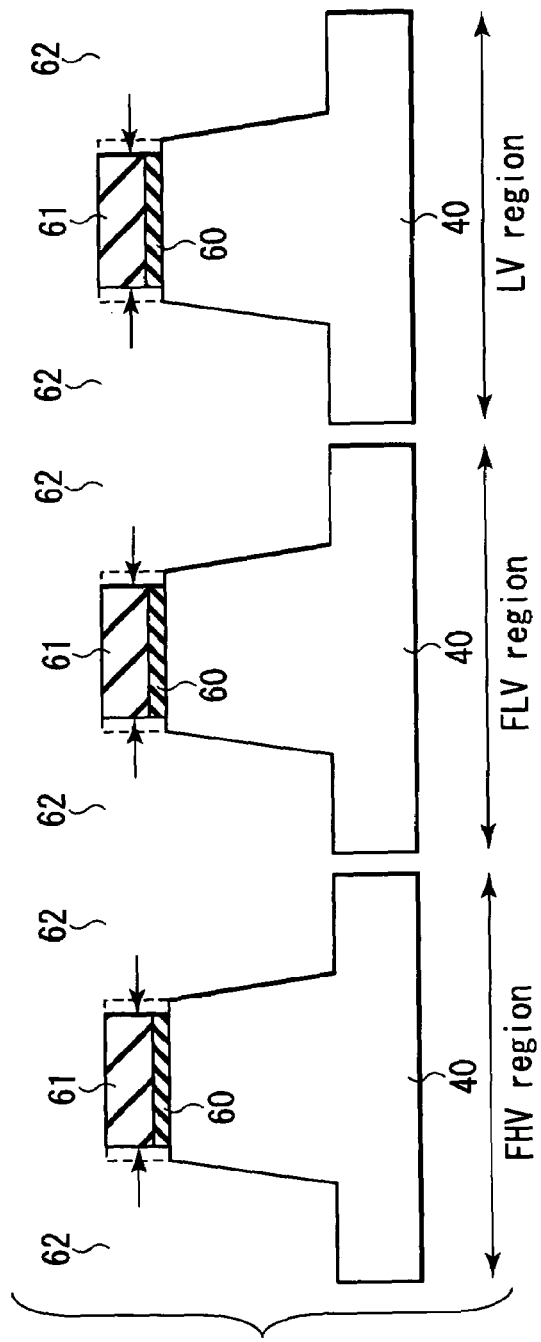

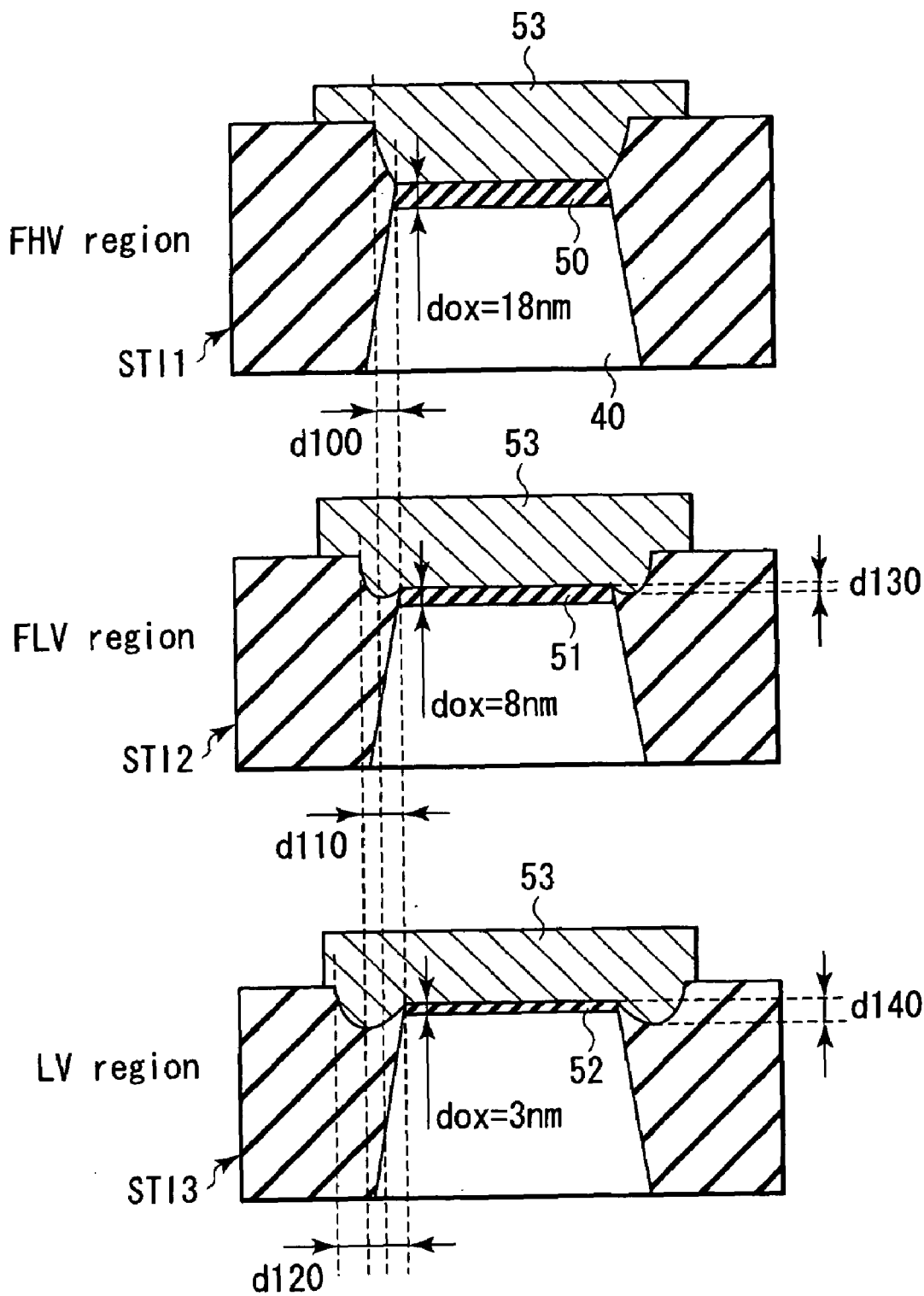
FIG. 29  d100<d110<d120
d130<d140

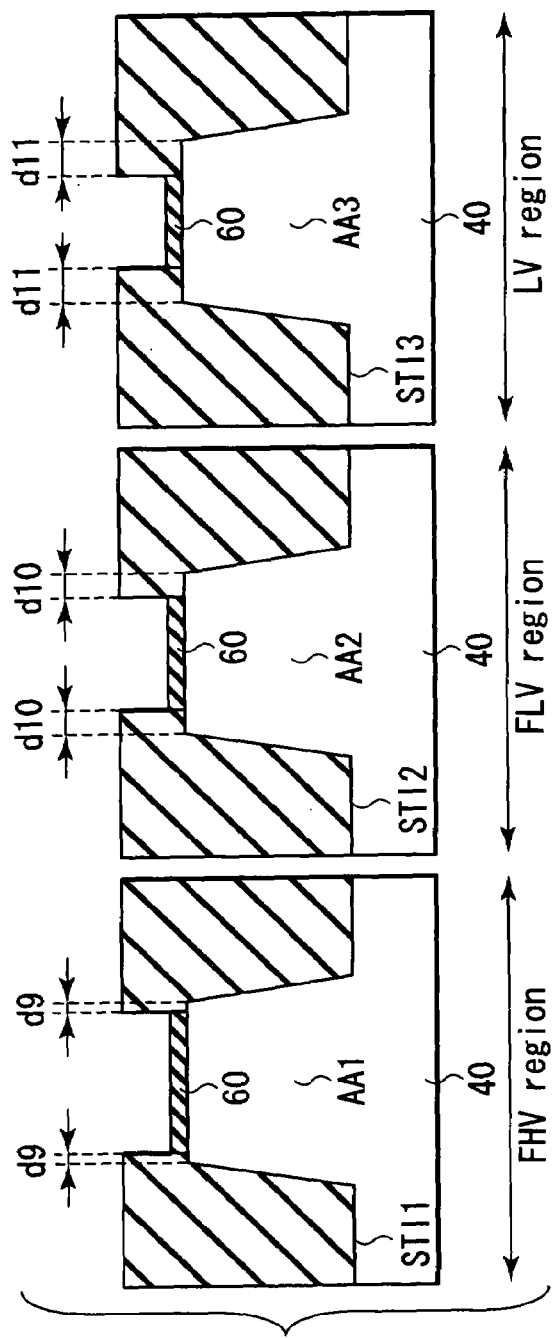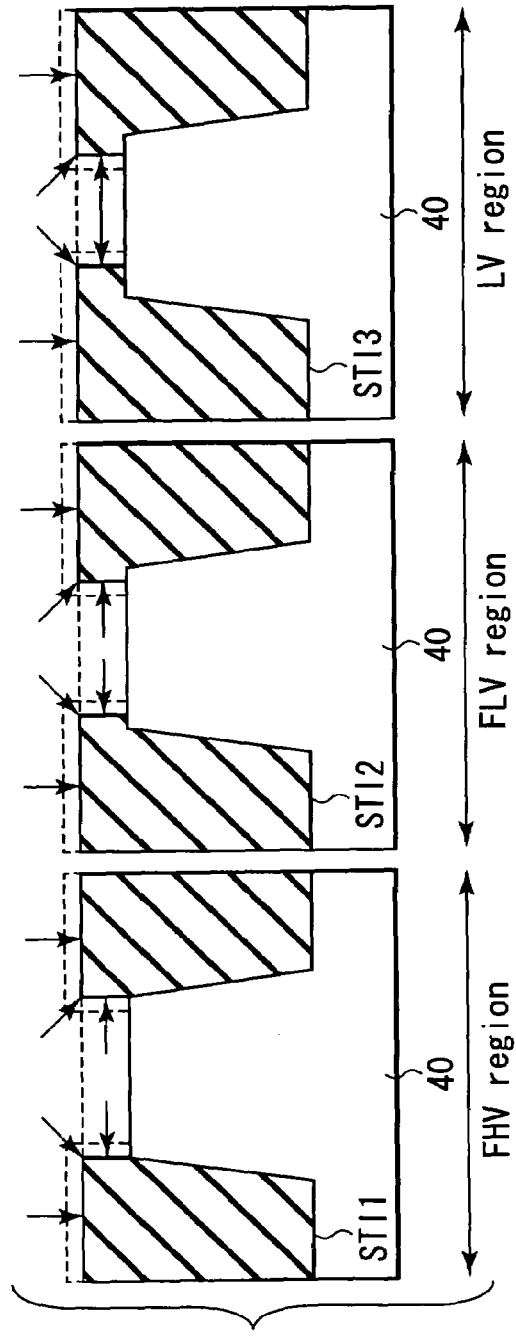
FIG. 33
FIG. 34

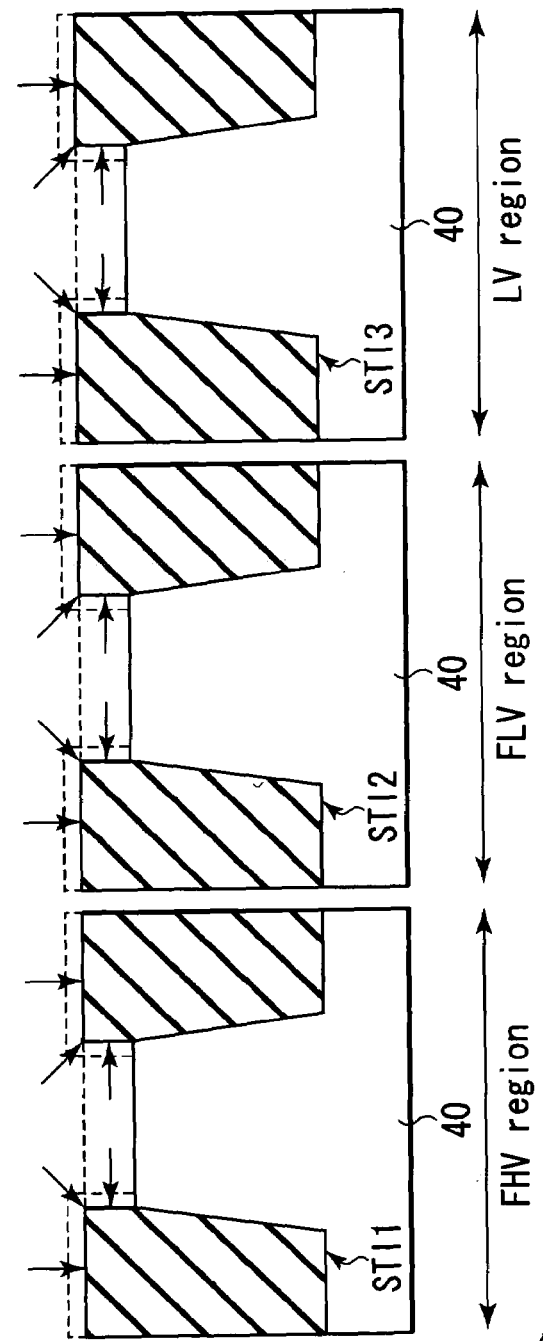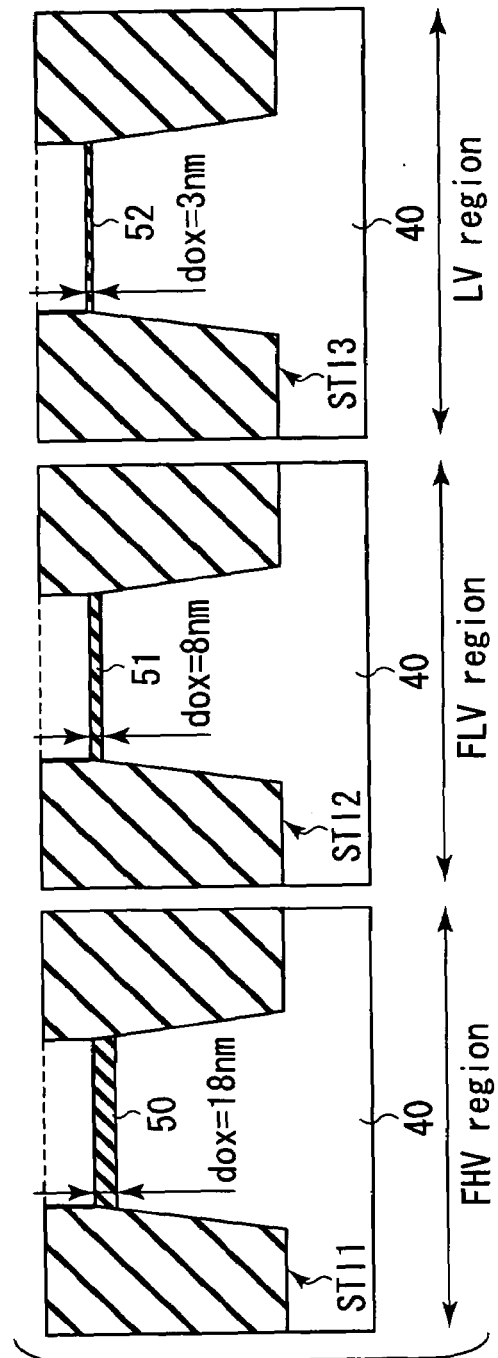

SEMICONDUCTOR MEMORY DEVICE WITH A STACKED GATE INCLUDING A FLOATING GATE AND A CONTROL GATE AND METHOD OF MANUFACTURING THE SAME

CROSS-REFERENCE TO RELATED APPLICATIONS

This application is based upon and claims the benefit of priority from prior Japanese Patent Application No. 2004-080809, filed Mar. 19, 2004, the entire contents of which are incorporated herein by reference.

BACKGROUND OF THE INVENTION

1. Field of the Invention

This invention relates to a semiconductor memory device and a method of manufacturing the semiconductor memory device. More specifically, this invention relates to a non-volatile semiconductor memory device with MOS transistors each having a floating gate and a control gate and a method of manufacturing the nonvolatile semiconductor memory device.

2. Description of the Related Art

NOR flash memories and NAND flash memories have been widely used as nonvolatile semiconductor memory devices.

In recent years, a flash memory combining the features of the NOR flash memory and the NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type has memory cells, each including two MOS transistors. In such a memory cell, one MOS transistor functioning as a nonvolatile memory section has a structure including a control gate and a floating gate and is connected to a bit line. The other MOS transistor, which is connected to a source line, is used to select a memory cell.

In the conventional flash memories, plural voltage value is used for operation, thus the peripheral circuit includes MOS transistors with various gate insulating film thicknesses. When an attempt is made to form the MOS transistors in the same processes, the structure of the gate electrode differs from one MOS transistor to another.

BRIEF SUMMARY OF THE INVENTION

A semiconductor memory device according to an aspect of the present invention comprises:

a first MOS transistor including a first gate electrode which is formed on a first element region enclosed by a first element isolating region formed in a semiconductor substrate with a first gate insulating film interposed between the first element region and the first gate electrode, an end portion of the first gate electrode in the gate width direction being located on the first element isolating region; and a second MOS transistor including a second gate electrode which is formed on a second element region enclosed by a second element isolating region formed in the semiconductor substrate with a second gate insulating film at least twice as thick as the first gate insulating film interposed between the second element region and the second gate electrode, an end portion of the second gate electrode in the gate width direction being located on the second element isolating region, the upper part of each of the first and second element isolating regions being formed so as to project from the surface of the semiconductor substrate and have their corners curved, and the width from the position where the first element isolating region contacts the first gate insulating film to the top surface end of the first element isolating region being equal to the width from the position where the second element isolating region contacts the second gate insulating film to the top surface end of the second element isolating region.

A method for fabricating a semiconductor memory device according to an aspect of the present invention comprises:

forming a first insulating film on a semiconductor substrate;

patterning the first insulating film to leave the first insulating film on a first and a second element region;

etching the semiconductor substrate by use of the first insulating film as a mask to make a plurality of trenches in the semiconductor substrate;

etching the side face of the first insulating film on the second element region, while protecting the first insulating film on the first element region;

forming a second insulating film on the semiconductor substrate to fill the trenches;

etching the second insulating film by use of the first insulating film as a stopper;

removing the first insulating film so as to form a first and a second element isolating region with which the trenches are filled and the upper parts of which project from the surface of the semiconductor substrate and enclose the first and second element regions respectively;

forming a first gate insulating film on the first and second element regions;

removing the first gate insulating film on the second element region, while protecting the first gate insulating film on the first element region and the first element isolating region;

forming on the second element region a second gate insulating film thinner than the first gate insulating film, while protecting the first gate insulating film on the first element region; and forming gate electrodes on the first and second gate insulating films.

BRIEF DESCRIPTION OF THE SEVERAL VIEWS OF THE DRAWING

FIG. 4 is a sectional view of the select gate decoder included in the flash memory of the first embodiment;

FIGS. 5 to 21 are sectional views showing sequentially a first to seventeenth process of manufacturing the select gate decoder included in the flash memory of the first embodiment;

FIGS. 22 to 28 are sectional views showing sequentially the first to seventh process of manufacturing the select gate decoder;

FIG. 29 is a sectional view of the select gate decoder;

FIGS. 30 to 35 are sectional views showing sequentially a first to a sixth process of manufacturing the select gate decoder included in a flash memory according to a first modification of the first embodiment;

FIGS. 37 to 44 are sectional views showing sequentially a first to an eighth process of manufacturing the select gate decoder included in a flash memory according to a second embodiment of the present invention;

FIGS. 45 to 48 are sectional views showing sequentially a first to a fourth process of manufacturing the select gate decoder included in a flash memory according to a modification of the second embodiment;

DETAILED DESCRIPTION OF THE INVENTION

Figure 1:
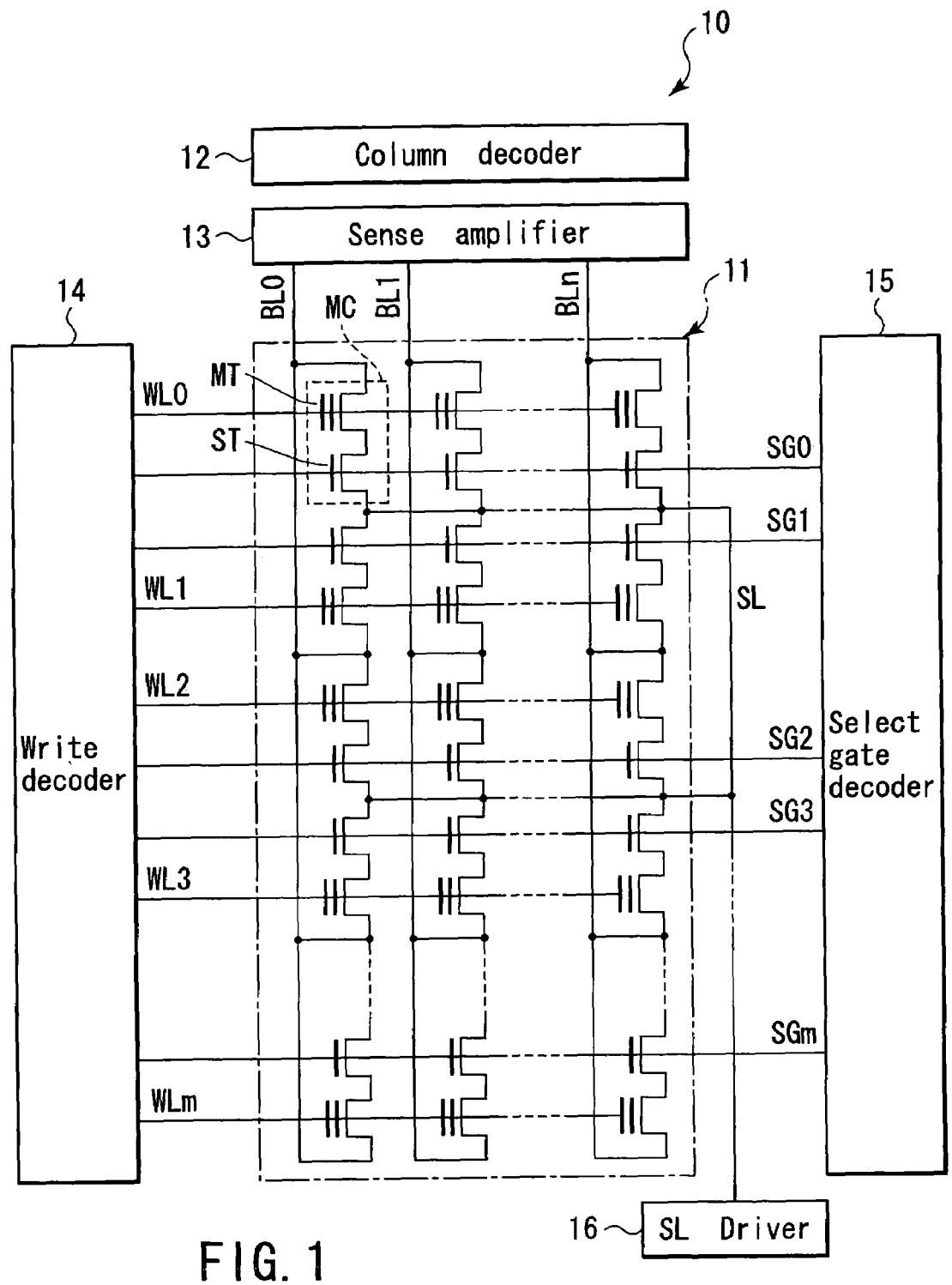
FIG. 1 is a block diagram of a flash memory according to a first embodiment of the present invention.

A semiconductor memory device according to a first embodiment of the present invention and a method of manufacturing the semiconductor memory device will be explained. FIG. 1 is a block diagram of a flash memory of the first embodiment.

As shown in FIG. 1, a flash memory 10 comprises a memory cell array 11, a column decoder 12, a sense amplifier 13, a write decoder 14, a select gate decoder 15, and a source line driver 16.

The memory cell array 11 has a plurality of ((m+1)×(n+1)) memory cells MCs (m and n are natural numbers) arranged in a matrix. Each of the memory cells MCs includes a memory cell transistor MT and a select transistor ST, which have their current paths connected in series with each other. The memory cell transistor MT has a stacked gate structure that includes a floating gate formed on a semiconductor substrate with a gate insulating film interposed therebetween and a control gate formed on the floating gate with an inter-gate insulating film interposed therebetween. The floating gates are separated on a memory cell transistor MT basis. Like the memory cell transistor MT, the select transistor ST has a stacked gate structure that includes the floating gate and the control gate. The select transistor ST differs from the memory cell transistor in that the floating gates of the select transistors STs in a same row are connected to one another and the floating gate and control gate are connected to each other electrically. The source region of the memory cell transistor MT is connected to the drain region of the select transistor ST. The memory cells MCs adjoining in the column direction share the source region of the select transistor ST or the drain region of the memory cell transistor MT.

The control gates of the memory cell transistors MTs of the memory cells MCs in a same row are connected commonly to any one of word lines WL0 to WLm. The control gates of the select transistors STs of the memory cells in a same row are connected commonly to any one of select gate lines SG0 to SGm. The drains of the memory cell transistors MTs of the memory cells MCs in a same column are connected commonly to any one of bit lines BL0 to BLn. The sources of the select transistors STs of the memory cells MCs are connected commonly to a source line SL, which is then connected to a source line driver 16.

A column decoder 12 selects any of the bit lines BL0 to BLn in a read operation.

A write decoder 14 decodes a row address signal, thereby producing a row address decode signal. In a write operation, the write decoder 14 selects any one of the word lines WL0 to WLm and applies a negative potential to the select gate lines SG0 to SGm.

A select gate decoder 15 selects any one of the select gate lines SG0 to SGm in a read operation.

A sense amplifier 13 amplifies the data read from the memory cell selected by the select gate decoder 15 and column decoder 12.

A source line driver 16 supplies a voltage to the source line SL in a read operation.

Figure 2:
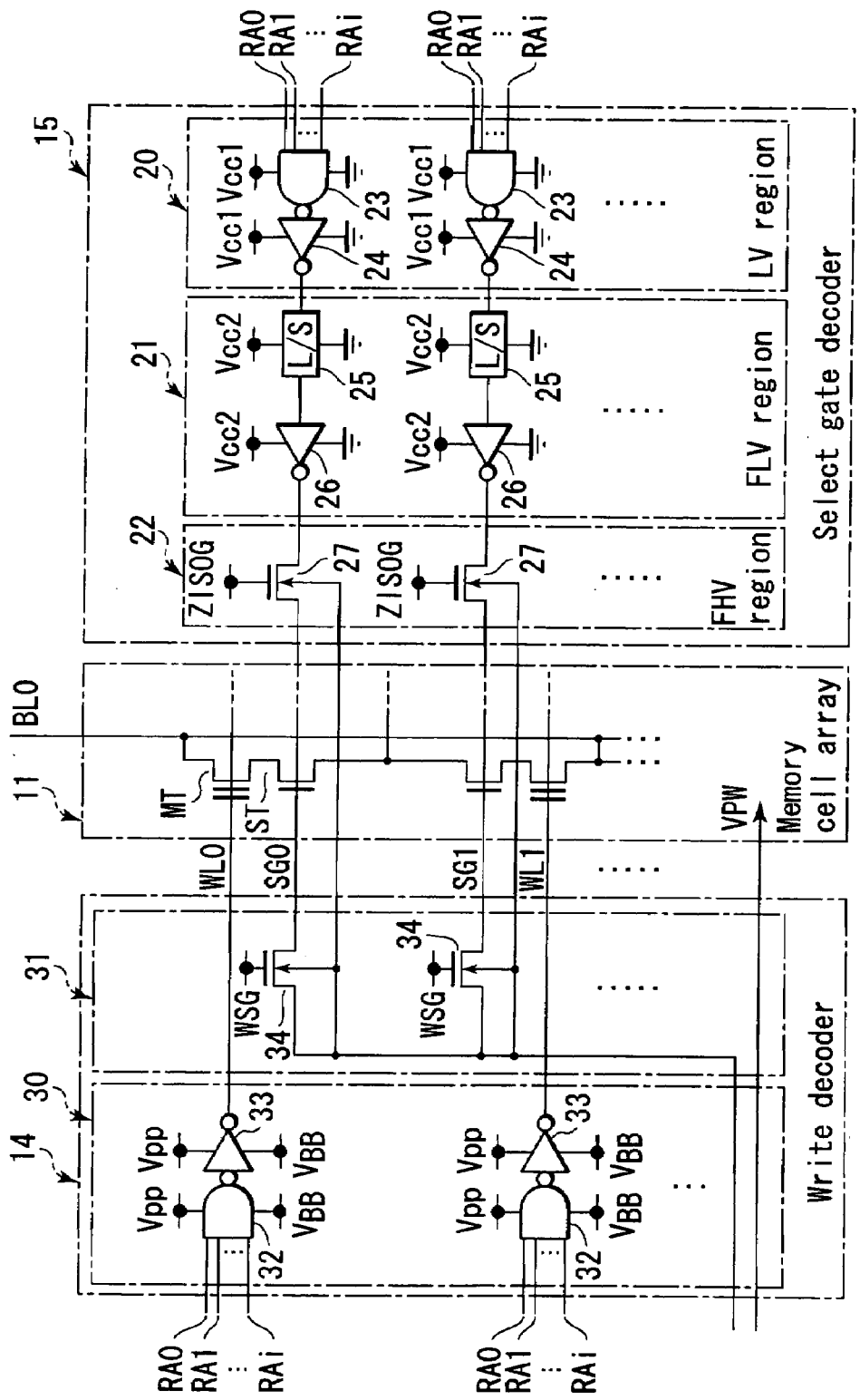
FIG. 2 is a circuit diagram of a write decoder, a memory cell array, and a select gate decoder included in the flash memory of the first embodiment.

The structure of the write decoder 14 and select gate decoder 15 will be explained by reference to FIG. 2. FIG. 2, which is a circuit diagram of a part of the flash memory 10, particularly shows the write decoder 14 and select gate decoder 15 in detail.

First, the structure of the select gate decoder 15 will be explained. The select gate decoder 15 includes a row address decode circuit 20, a voltage converting circuit 21, and a switch element group 22. The row address decode circuit 20, which operates on a power supply voltage Vcc1 (=1.25 to 1.65 V), decodes (i+1)-bit row address signals RA0 to RAi, thereby producing a row address decode signal. The row address decode circuit 20 has sets of a NAND circuit 23 and an inverter 24 in such a manner that the sets are provided for the select gate lines SG0 to SGm in a one-to-one correspondence. The NAND circuit 23 performs NAND operation of each bit in the row address signals RA0 to RAi. The inverter 24 inverts the result of the NAND operation and outputs the inverted result as a row address decode signal.

The voltage converting circuit 21, which operates on a power supply voltage Vcc2 (=2.5 to 3.6 V), converts a row address decode signal of a Vcc1 level into that of a Vcc2 level. The voltage converting circuit 21 has sets of a level shift circuit 25 and an inverter 26 in such a manner that the sets are provided for the select gate lines SG0 to SGm in a one-to-one correspondence. The level shift circuit 25 converts the voltage level of the row address decode signal into the Vcc2 level. The inverter 26 inverts the output of the level shift circuit 25.

The switch element group 22 has n-channel MOS transistors 27 in such a manner that the transistors 27 are provided for the select gate lines SG0 to SGm in a one-to-one correspondence. The outputs of the inverters 26 are supplied to the select gate lines SG0 to SGm via the current paths of the n-channel MOS transistors 27. A control signal ZISOG is inputted to the gates of the n-channel MOS transistors 27.

Next, the structure of the write decoder 14 will be explained. The write decoder 14 includes a row address decode circuit 30 and a switch element group 31. The row address decode circuit 30, which operates on power supply voltages Vpp (=12 V) and VBB (=−8 V), decodes (i+1)-bit row address signals RA0 to RAi, thereby producing a row address decode signal. The row address decode signal is supplied to the word lines WL0 to WLm. The row address decode circuit 30 has sets of a NAND circuit 32 and an inverter 33 in such a manner that the sets are provided for the word lines WL0 to WLm in a one-to-one correspondence. The NAND circuit 32 performs NAND operation on each bit in the row address signals RA0 to RAi. The inverter 33 inverts the result of the NAND operation and outputs the inverted result as a row address decode signal.

The switch element group 31 has n-channel MOS transistors 34. The n-channel MOS transistors 34 are provided for the select gate lines SG0 to SGm in a one-to-one correspondence. One end of the current path of each of the transistors 34 is connected to the corresponding one of the select gate lines SG0 to SGm. A control signal WSG is inputted to the gates of the n-channel MOS transistors 34.

Figure 3:
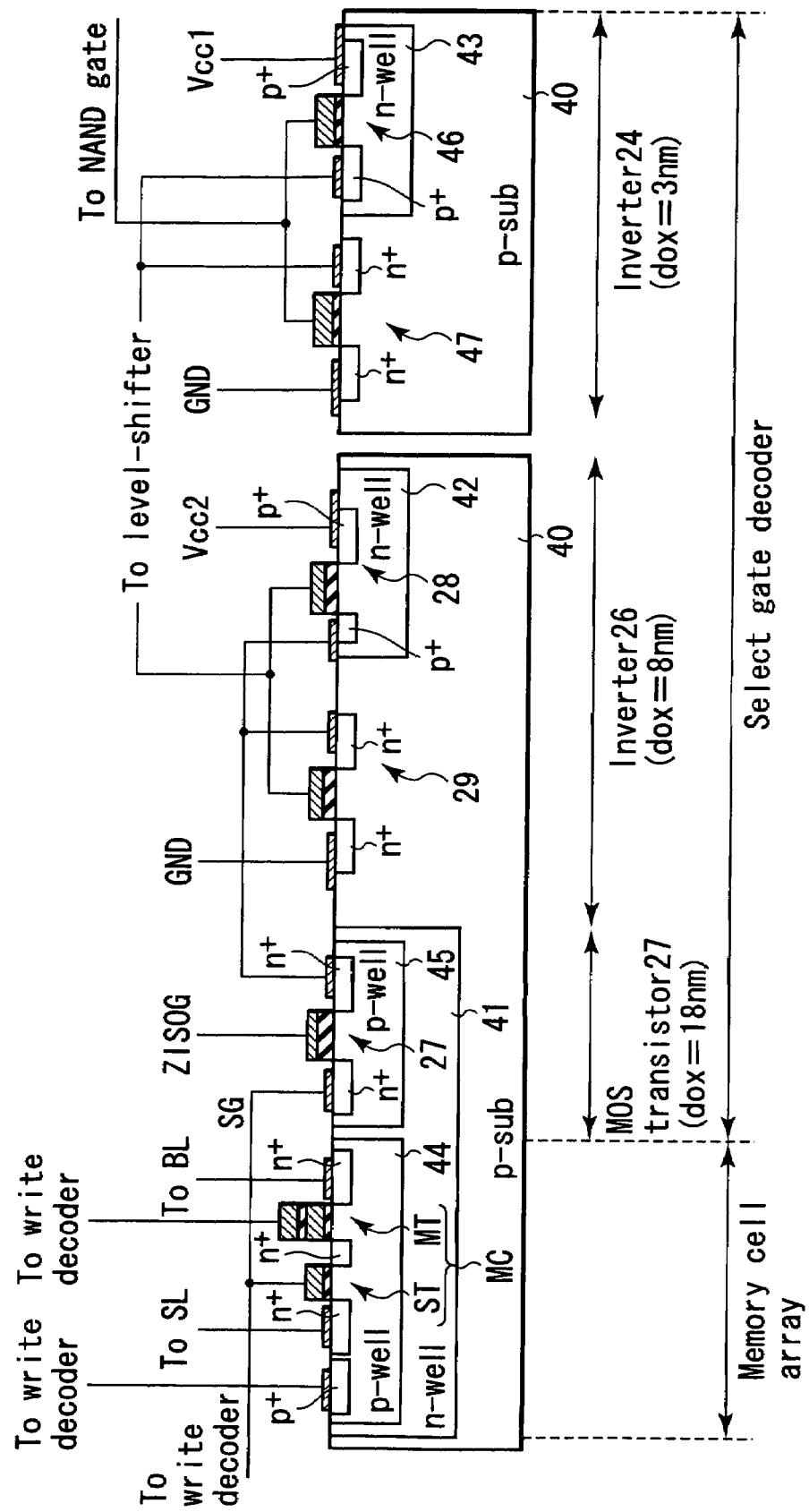
FIG. 3 is a sectional view of the memory cell array and select gate decoder included in the flash memory of the first embodiment.

FIG. 3 is a sectional view of a part of the memory call array 11 and select gate decoder 15. FIG. 3 shows only a memory cell MC, inverters 24, 26, and a MOS transistor 27.

As shown in FIG. 3, at the surface of a semiconductor substrate 40, n-well regions 41 to 43 are formed in such a manner that they are isolated from one another. The n-well region 41 is for forming a memory cell MC in the memory cell array 11 and an n-channel MOS transistor 27 in the select gate decoder 15. The n-well regions 42, 43 are for forming the inverters 26, 24 in the select gate decoder 15.

P-well regions 44 and 45 are further formed at the surface of the n-well region 41. A memory cell MC and an n-channel MOS transistor 27 are formed on the p-well regions 44, 45, respectively. Although the select transistor ST in the memory cell has been represented as a single-layer gate, it may have a stacked gate structure as in the memory cell transistor MT. Then, the p-well region 44 is connected to the write decoder 14. The source of the n-channel MOS transistor 27 is connected to the select gate line.

The inverter 26 includes a p-channel MOS transistor 28 and an n-channel MOS transistor 29. A p-channel MOS transistor 28 is formed on the n-well region 42. An n-channel MOS transistor 29 is formed on the p-type semiconductor substrate 40. The voltage Vcc2 is applied to the n-well region 42. The source of the p-channel MOS transistor 28 is connected to the voltage Vcc2 node. The drain of the p-channel MOS transistor 28 is connected to the drain of the n-channel MOS transistor 27. The source of the n-channel MOS transistor 29 is connected to GND. The drain of the n-channel MOS transistor 29 is connected to the drain of the n-channel MOS transistor 27. The gates of the p-channel MOS transistor 28 and n-channel MOS transistor 29 are connected to the level shift circuit 25 (not shown).

The inverter 24 includes a p-channel MOS transistor 46 and an n-channel MOS transistor 47. A p-channel MOS transistor 46 is formed on the n-well region 43. An n-channel MOS transistor 47 is formed on the p-type semiconductor substrate 40. The voltage Vcc1 is applied to the n-well region 43. The source of the p-channel MOS transistor 46 is connected to the voltage Vcc1 node. The drain of the p-channel MOS transistor 46 is connected to the level shift circuit 25. The source of the n-channel MOS transistor 47 is connected to GND. The drain of the n-channel MOS transistor 47 is connected to the level shift circuit 25. The gates of the p-channel MOS transistor 46 and n-channel MOS transistor 47 are connected to the NAND gate 23 (not shown).

The film thickness of the gate insulating film of the p-channel MOS transistor 27 is about 18 nm, the film thickness of the gate insulating film of each of the p-channel MOS transistor 28 and n-channel MOS transistor 29 is about 8 nm, and the film thickness of the gate insulating film of each of the p-channel MOS transistor 46 and n-channel MOS transistor 47 is about 3 nm. The reason why the film thickness of the gate insulating film differs from one MOS transistor to another is that the voltage dealt with by each MOS transistor differs from one MOS transistor to another. Specifically, the p-channel MOS transistor 27 deals with a high voltage of VBB (−8 V) in a write operation. The p-channel MOS transistor 28 and n-channel MOS transistor 29 deal with a relatively high voltage of Vcc2 (2.5 to 3.6 V) in a read operation. The p-channel MOS transistor 46 and n-channel MOS transistor 47 deal with Vcc1 (1.25 to 1.65 V), a low voltage.

Hereinafter, the region where the n-channel MOS transistor 27 is formed (the region where the voltage dealt with is at the VBB level and the gate insulating film thickness dox of the MOS transistor is 18 nm) is called an FHV region. The region where the inverter 26 is formed (the region where the voltage dealt with is at the Vcc2 level and the gate insulating film thickness dox of the MOS transistor is 8 nm) is called an FLV region. In addition, the region where the inverter 24 is formed (the region where the voltage dealt with is at the Vcc1 level and the gate insulating film thickness dox of the MOS transistor is 3 nm) is called an LV region.

The structure of the MOS transistor in each of the FHV region, FLV region, and LV region will be explained by reference to FIG. 4. FIG. 4 is a sectional view of MOS transistors in the individual regions, taken in the gate width direction. As an example, a MOS transistor 27 formed in the FHV region, a MOS transistor 29 formed in the FLV region, and a MOS transistor 47 formed in the LV region will be explained.

As shown in FIG. 4, in the semiconductor substrate 40 in each of the FHV region, FLV region, and LV region, element isolating regions STI1, STI2, and STI3 are formed respectively. Above the element regions AA1 to AA3 surrounded by the element isolating regions STI1 to STI3, a gate electrode 53 is formed with each of the respective gate insulating films 50 to 52 interposed therebetween. The gate electrode 53 is formed so that both ends of the electrode 53 may be located on the element isolating regions. As described above, the film thicknesses dox of the gate insulating films 50 to 52 formed in the FHV region, FLV region, and LV region are 18 nm, 8 nm, and 3 nm, respectively. The top surface of each of the element isolating regions STI1 to STI3 projects from the surface of the semiconductor substrate 40. If the height from the surface of the semiconductor substrate 40 (gate insulating film) to the top surface of each of the element isolating regions STI1 to STI3 are d1, d2, and d3 respectively, the expression d1>d2>d3 holds.

The top corners of the element isolating regions STI1 to STI3 are rounded. The distances from the positions where the gate insulating films 50 to 52 contact the element isolating regions STI1 to STI3 to the top surface ends of the element isolating regions STI1 to STI3 are all made equal. Specifically, if the distance from the position where the gate insulating film 50 contacts the element isolating region STI1 to the top surface end of the element isolating region STI1 is d4, the distance from the position where the gate insulating film 51 contacts the element isolating region STI2 to the top surface end of the element isolating region STI2 is d5, and the distance from the position where the gate insulating film 52 contacts the element isolating region STI3 to the top surface end of the element isolating region STI3 is d6, the equation d4=d5=d6 holds.

Next, the operation of the flash memory 10 configured as described above will be explained briefly.

<Write Operation>

Data is written simultaneously into all of the memory cells connected to any one of the word lines. Either "0" data or "1" data is written, depending on whether electrons are injected into the floating gate of the memory cell transistor MT. Electrons are injected into the floating gate by Fowler- Nordheim (FN) tunneling. Hereinafter, explanation will be given by reference to FIGS. 1 to 3.

First, in FIG. 1, writing data ("1" or "0") is inputted from an I/O terminal (not shown). Then, the writing data is inputted to each of the latch circuits (not shown) provided for the bit lines in a one-to-one correspondence. When "1" data is stored in the latch circuit, the latch circuit supplies 0 V to the corresponding bit line. Conversely, when "0" data is stored in the latch circuit, the latch circuit supplies VBB (−8 V) to the corresponding bit line.

Then, the write decoder 14 selects any one of the word lines WL0 to WLm. The write decoder 14 supplies Vpp (e.g. 12 V) to the selected word line. In response to the inputted row address signals RA0 to RAi, the row address decode circuit 31 outputs the voltage Vpp to the word line corresponding to the row address signal. In addition, the control signal WSG is made high and all of the MOS transistors 34 are turned on. Then, the negative voltage VBB is supplied to the select gate lines SG0 to SGm via the current paths of the MOS transistors 34. Thus, all of the select transistors STs go into the off state. As a result, the select transistors STs are separated from the source line ST electrically. The write decoder 14 supplies the negative potential VBB to the p-well region 44 in which a memory cell is formed. The control signal ZISOG is made low, with the result that all of the MOS transistors 27 are in the off state.

As a result, the potential corresponding to "1" data or "0" data is applied to the drain region of the memory cell transistor MT via the corresponding bit line. More specifically, 0 V is applied to the drain region of the memory cell transistor MT into which "1" data is to be written, and VBB (−8 V) is applied to the drain region of the memory cell transistor MT into which "0" data is to be written. Then, Vpp (12 V) is applied to the selected word line WL. Thus, in the memory cell transistor MT into which "1" data is to be written, since the potential difference (12 V) between the gate and drain is insufficient, no electron is injected into the floating gate, with the result that the memory cell transistor MT holds the negative threshold value. On the other hand, in the memory cell transistor MT into which "0" data is to be written, since the potential difference (20 V) between the gate and drain is large, electrons are injected into the floating gate by FN tunneling. As a result, the threshold value of the memory cell transistor MT changes to positive.

<Read Operation>

In a read operation, data can be read simultaneously from a plurality of memory cells connected to any one of the word lines. Hereinafter, explanation will be given using FIGS. 1 to 3.

First, the select gate decoder 15 selects any one of the select gate lines SG0 to SGm. In response to the inputted row address signals RA0 to RAi, the corresponding row address decode circuits 20 (inverters 24) outputs a row address decode signal of the voltage Vcc1 level. The voltage level of the row address decode signal is converted into the Vcc2 level at the voltage converting circuit 21. Then, the control signal ZISOG is made high and the MOS transistor 27 is turned on. As a result, a high level (Vcc2) is supplied to the selected select gate line and a low level (0 V) is supplied to the unselected select gate lines. Accordingly, the select transistors STs connected to the selected select gate line are turned on. The select transistors STs connected to the unselected select gate lines are turned off. Thus, the select transistors STs in the selected memory cell are connected to the source line SL electrically. The write decoder 14 places all of the word lines WL0 to WLm at the low level (0 V). The source line driver 16 sets the potential of the source line SL to 0 V. The control signal WSG is made low, with the result that all of the MOS transistors 34 are in the off state.

Then, for example, about 1 V is applied to each of the bit lines BL0 to BLn. Then, since the memory cell transistor MT of a memory cell MC into which "1" data has been written has a negative threshold voltage, the transistor MT is turned on. Thus, in the memory cell MC connected to the selected select gate line, current flows from the bit line toward the source line SL through the current paths of memory cell transistor MT and select transistor ST. On the other hand, since the memory cell transistor MT of a memory cell MC into which "0" data has been written has a positive threshold voltage, it is in the off state. Thus, no current flows from the bit line toward the source line.

As a result, the potentials on the bit lines BL0 to BLn vary. The variations are amplified by the sense amplifier 13, thereby carrying out the read operation.

<Erase Operation>

The data in all of the memory cells sharing a well region is erased at the same time. Therefore, in the example of FIG. 1, the contents in all the memory cells included in the memory cell array 11 are erased simultaneously.

In FIG. 2, the write decoder 14 applies the negative potential VBB (−8 V) to all of the word lines WL0 to WLm and the positive potential Vpp (12 V) to the p-well region 44. As a result, electrons are pulled out of the floating gates of the memory cell transistors of the memory cells MCs into the semiconductor substrate by FN tunneling. As a result, the threshold voltages of all of the memory cells MCs become negative, thereby erasing the data.

Figure 14:
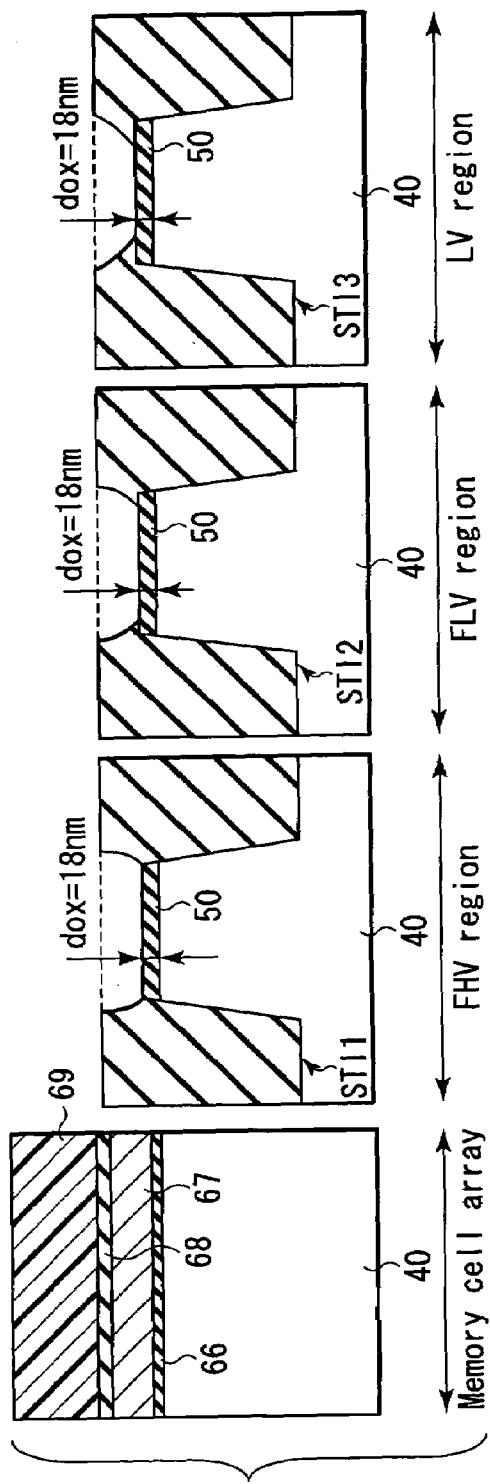
Figure 19:
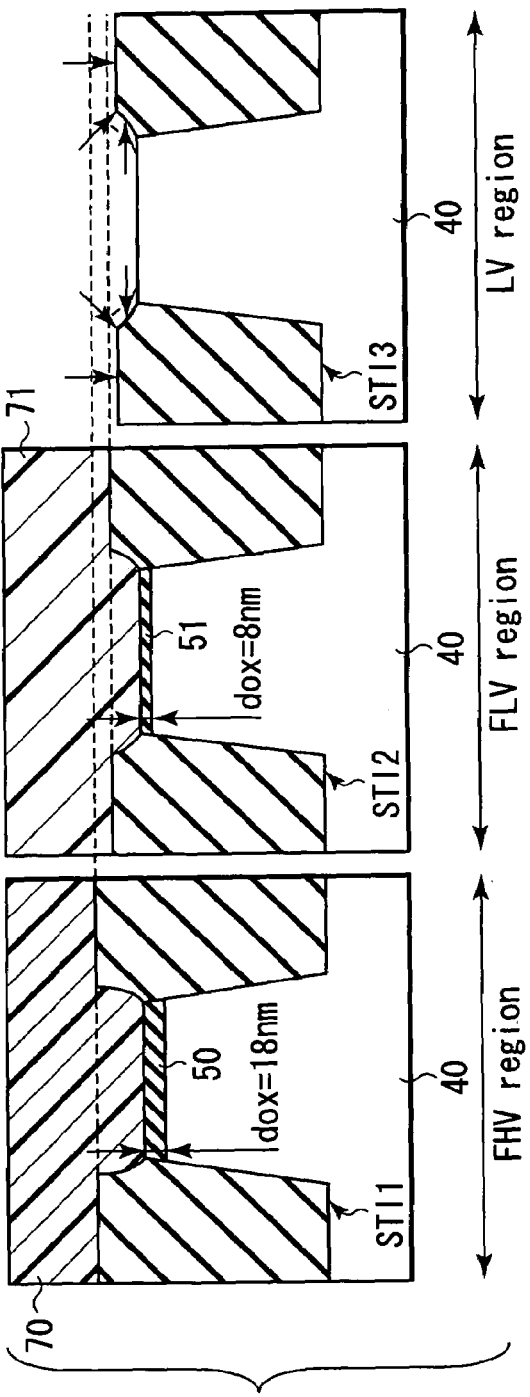
Figures 20, 21:
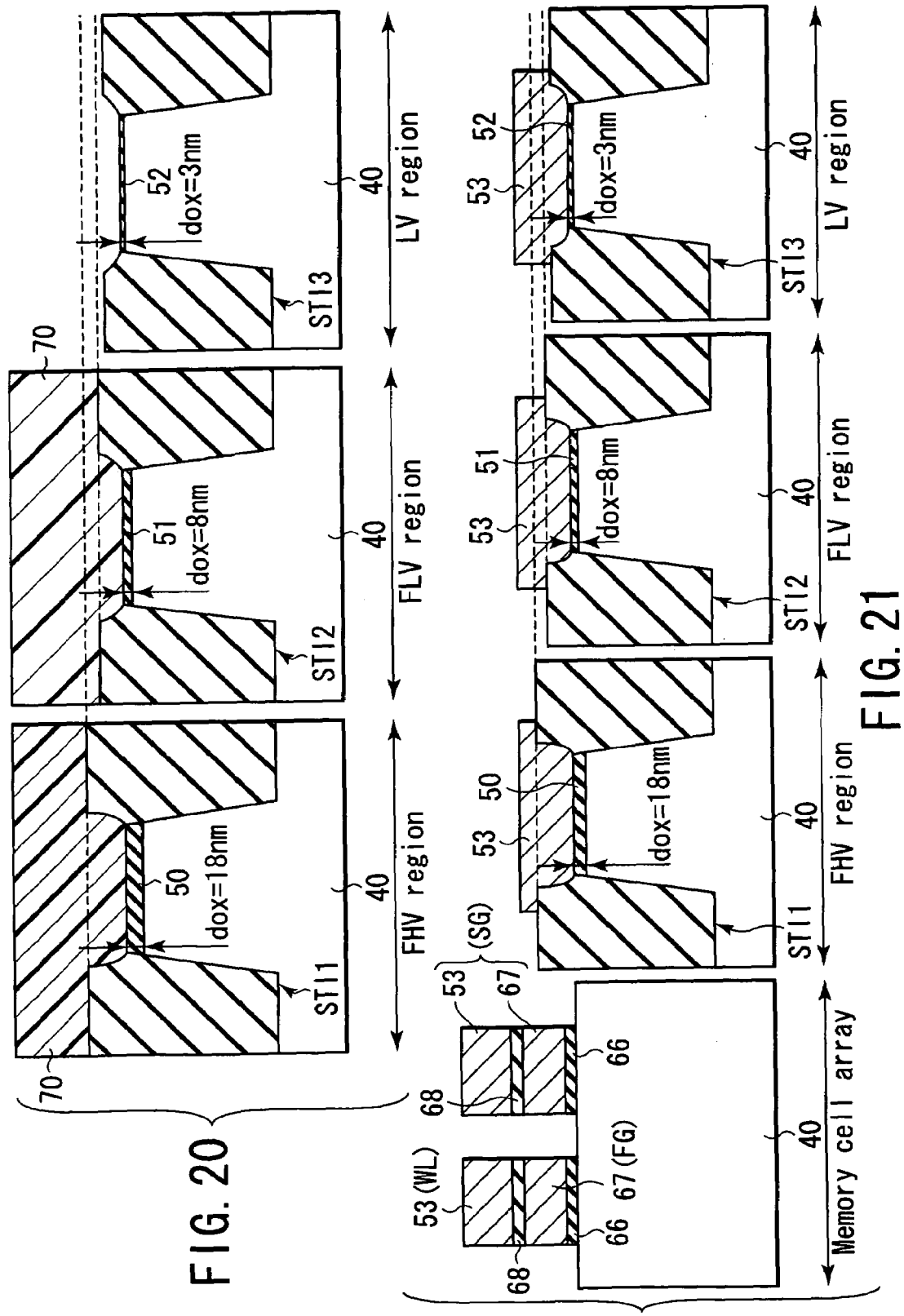

Next, a method of manufacturing a flash memory with the aforementioned configuration will be explained by reference to FIGS. 5 to 21, centering on a select gate decoder. FIGS. 5 to 21 are sectional views showing sequentially the processes of manufacturing a flash memory according to the first embodiment. FIGS. 5 to 20 excluding FIGS. 14 and 21 are sectional views, in the gate width direction, of MOS transistors in the FHV region, FLV region, and LV region of a select gate decoder. FIGS. 5 to 21 correspond to FIG. 4. FIGS. 14 and 21 further show sectional views of a memory cell array region in the bit line direction.

As shown in FIG. 5, a pad oxide film 60 with a film thickness of, for example, 6 nm is formed on the semiconductor substrate 40. The pad oxide film 60 is a silicon oxide film formed by CVD (Chemical Vapor Deposition) techniques using, for example, TEOS (Tetraorthosilicate glass). A pad silicon nitride film 61 with a film thickness of, for example, 100 nm is formed on the oxide film 60.

Figure 6:
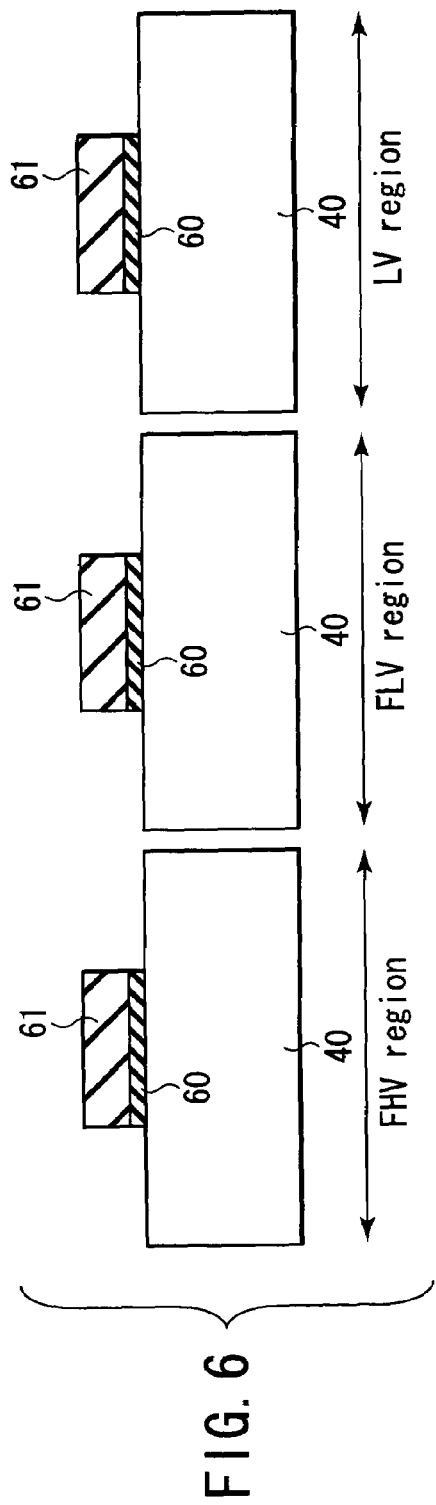

Next, by photolithographic techniques and etching, the silicon nitride film 61 and pad oxide film 60 are patterned as shown in FIG. 6. As a result, in the FHV region, FLV region, and LV region, the silicon nitride film 61 and pad oxide film 60 are left only in the regions in which element regions AA1 to AA3 are to be formed. While in FIG. 6, the widths of the silicon nitride film 61 and pad oxide film 60 in each region are all the same, their widths (the width of the element region) may be the largest in the FHV region and the smallest in the LV region. The reason for this is that the FHV region handles the highest voltage (with a larger transistor size) and the LV region deals with the lowest voltage (with a smaller transistor size).

Figure 7:
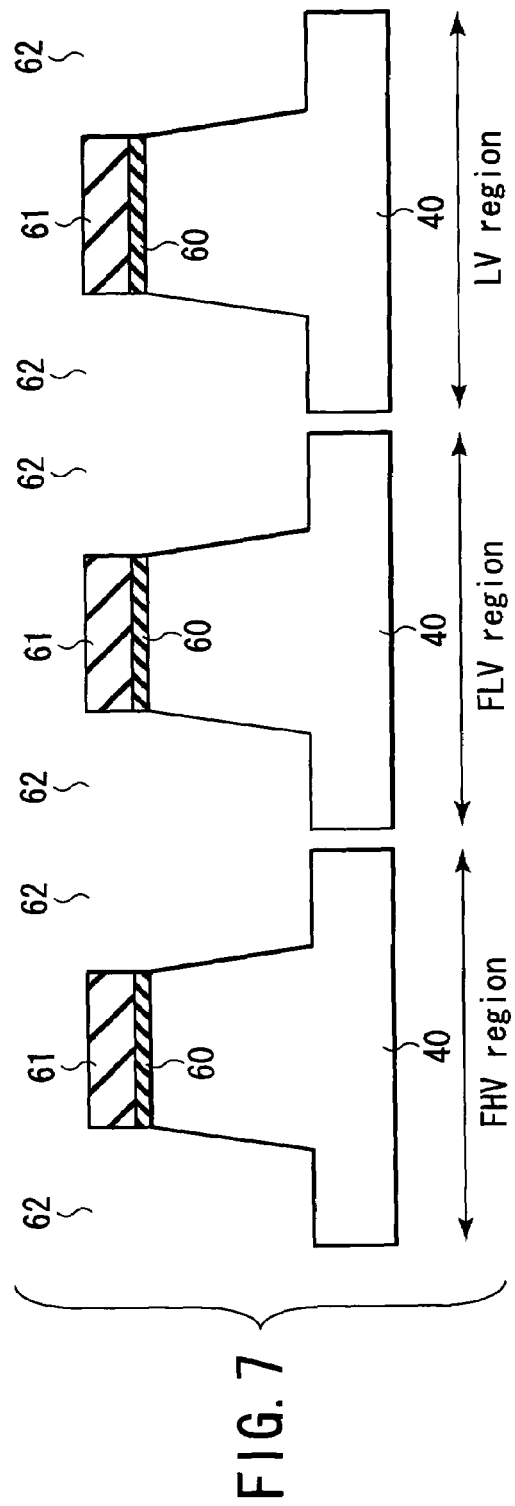

Next, by anisotropic etching, such as RIE (Reactive Ion Etching) techniques, with the silicon nitride film 61 as a mask, the semiconductor substrate 40 is etched as shown in FIG. 7. As a result, trenches 62 as shown in FIG. 7 are made.

The processes in FIGS. 5 to 7 are carried out also in the memory cell array region. Then, as shown in FIG. 8, in the memory cell array region and FHV region, a silicon oxide film 63 with a film thickness of about 15 nm is formed by CVD techniques using, for example, TEOS, on the surface of the semiconductor substrate 40, the side face of the pad oxide film 60, and the surface of the silicon nitride film 61. Instead of the silicon oxide film, any material that has an etching selectivity against the silicon nitride film may be used. With the memory cell array region and FHV region protected by the silicon oxide film 63, the sidewall of the silicon nitride film 61 in the FLV region and LV region is etched.

Next, as shown in FIG. 9, a silicon oxide film 64 with a film thickness of about 15 nm is formed by CVD techniques using, for example, TEOS, on the surface of the semiconductor substrate 40, the side face of the pad oxide film 60, and the surface of the silicon nitride film 61 in the FLV region. The silicon oxide film 64 may be formed in the memory cell array region and FHV region. Instead of the silicon oxide film 64, any material that has the etching selectivity against the silicon nitride film may be used. With the memory cell array region, FHV region, and FLV region protected by the silicon oxide film 64, the sidewall of the silicon nitride film 61 in the LV region is etched.

Next, as shown in FIG. 10, a silicon oxide film 65 is formed on the semiconductor substrate 40 by HDP (High Density Plasma)-CVD techniques, or the like, thereby filling up the trenches 61. Then, as shown in FIG. 11, by CMP (Chemical Mechanical Polishing) using the silicon nitride film 61 as a stopper, the silicon oxide film 65 is polished. As a result, element isolating regions STI1 to ST13 are formed as shown in the figure, which completes the element regions AA1 to AA3. Specifically, each of the element isolating regions STI1 to STI3 has such a shape as has its top projecting from the surface of the semiconductor substrate 40. Then, the silicon nitride film 61 is removed, thereby producing a structure of FIG. 12.

Next, as shown in FIG. 13, the pad oxide film 60 is removed by, for example, wet etching techniques. At this time, part of the element isolating regions STI1 to STI3 made of the silicon oxide film 65 are etched. Specifically, the tops, the side faces, and the corners of the element isolating regions STI1 to STI3 are etched.

The processes in FIGS. 10 to 13 are also carried out in the memory cell array region. Next, as shown in FIG. 14, in the memory cell array region, a gate insulating film 66, a polysilicon layer 67, and an inter-gate insulating film 68 for a memory cell transistor MT and a select transistor ST are formed. Although the gate insulating film 66, polysilicon layer 67, and inter-gate insulating film 68 are also formed in the FHV region, FLV region, and LV region, all of the layers in these regions are removed. Thereafter, the memory cell region is protected by, for example, a photoresist 69. Then, impurities are introduced into the semiconductor substrate 40 in the FHV region, FLV region, and LV region by, for example, ion implantation techniques. The impurity introducing process is carried out to control, for example, the threshold value of a MOS transistor. At this time, the memory cell array region is protected by the photoresist 69. Furthermore, at the surface of the semiconductor substrate 40 in the FHV region, FLV region, and LV region, a 18-nm-thick gate insulating film 50 is formed by, for example, thermal oxidation techniques.

Figure 15:
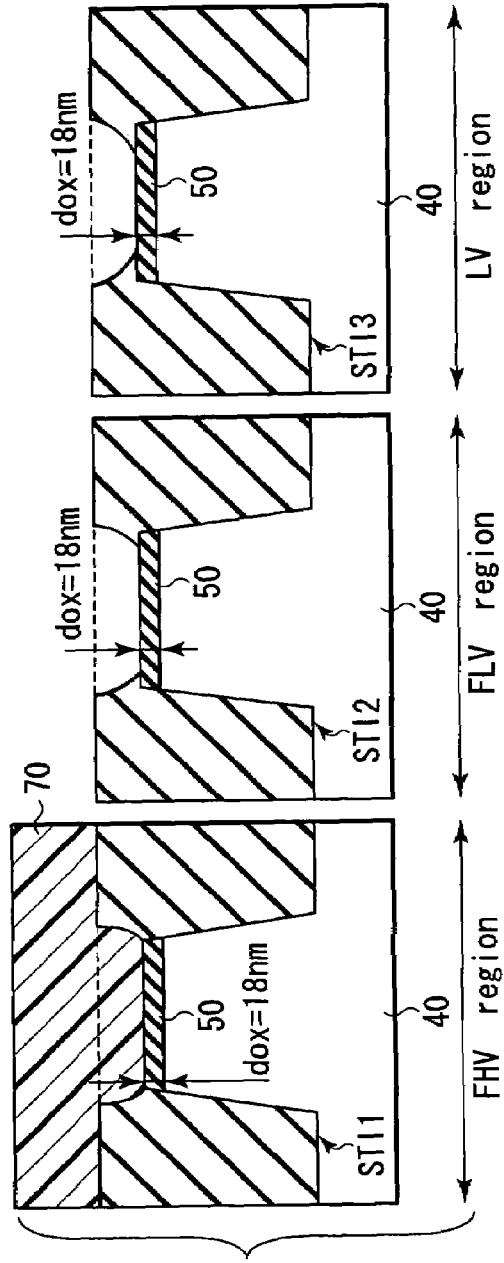

Next, as shown in FIG. 15, the FHV region is protected by a photoresist 70. Then, as shown in FIG. 16, the gate insulating film 50 in the FLV region and LV region are removed by, for example, wet etching techniques. Of course, the gate insulating film 50 in the FHV region protected by the photoresist 70 is not etched. Although part of the element isolating regions STI2, STI3 are etched, the element isolating region STI1 is not etched. That is, the top surfaces, side faces, and corners of the element isolating regions STI2, STI3 are further etched.

Next, as shown in FIG. 17, at the surface of the semiconductor substrate 40 in the FLV region and LV region, an 8-nm-thick gate insulating film 51 is formed by, for example, thermal oxidation techniques.

Figure 18:
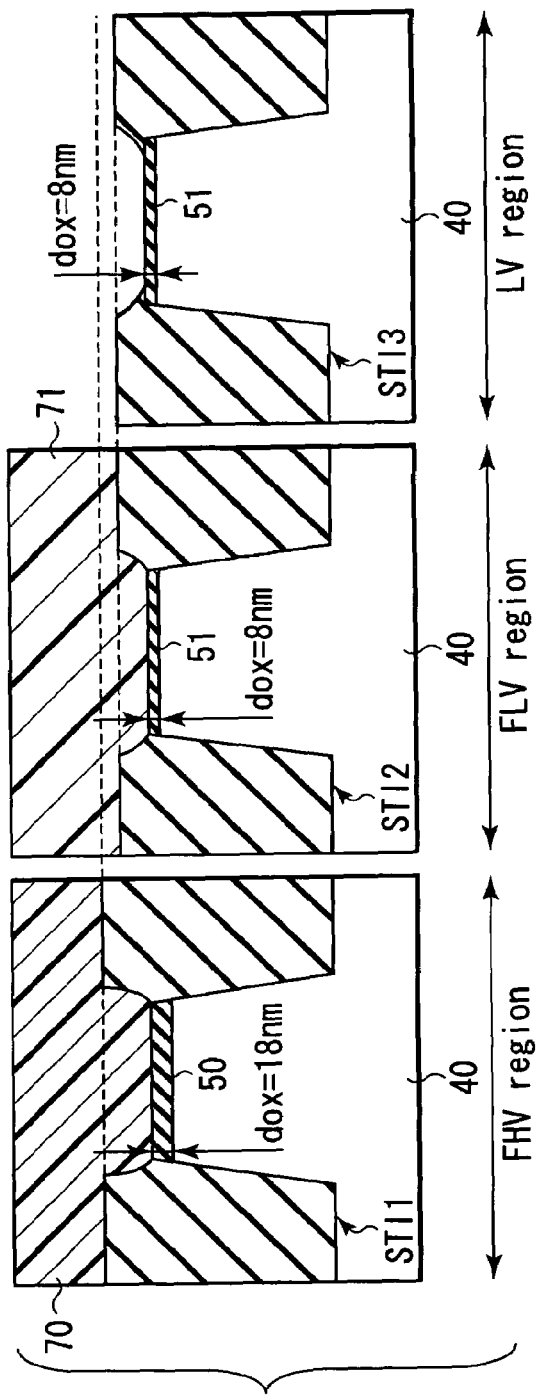

Next, as shown in FIG. 18, the FLV region is protected by a photoresist 71. Then, as shown in FIG. 19, the gate insulating film 51 in the LV region is removed by, for example, wet etching techniques. Of course, the gate insulating films 50, 51 protected by the photoresists 70, 71 are not etched. Although part of the element isolating region STI3 is etched, the element isolating regions STI1, STI2 are not etched. That is, the top surface, side face, and corner of the element isolating region STI3 are further etched.

Next, as shown in FIG. 20, at the surface of the semiconductor substrate 40 in the LV region, a 3-nm-thick gate insulating film 52 is formed by, for example, thermal oxidation techniques.

By the processes of FIGS. 14 to 21, the gate insulating films 50 to 52 of the MOS transistors are completed in the FHV region, FLV region, and LV region. In the meantime, the memory cell array region is protected by the photoresist 69. Thereafter, a polysilicon layer 53 is formed on the memory cell array region, FHV region, FLV region, and LV region. In the memory cell array region, the polysilicon layer 53, inter-gate insulating film 68, and polysilicon layer 67 are patterned into gate electrode patterns for the memory cell transistor MT and select transistor ST. The polysilicon layer 67 of the memory cell transistor MT functions as a floating gate FG and the polysilicon layer 53 functions as a control gate. In the select transistor, the polysilicon layers 67, 53, which are connected to each other electrically, both function as select gates. In the FHV region, FLV region, and LV region, too, the polysilicon layer 53 is patterned into a gate electrode pattern for a MOS transistor.

Thereafter, impurities are implanted into the semiconductor substrate 40, thereby forming the source and drain of each of MOS transistor. Then, interlayer insulating films, metal wiring layers, and others are formed, which completes the flash memory 10.

As described above, with the flash memory of the first embodiment, the distance between the position where the element isolating region contacts the gate insulating film and the top surface end of the element isolating region can be made equal in a plurality of MOS transistors having different gate insulating film thicknesses. In other words, the position of the end of the element isolating region can be made equal among a plurality of MOS transistors having different gate insulating film thicknesses. Thus, the characteristics of the MOS transistors can be made equal, which improves the reliability of the flash memory. This is because the positional relationship between the sidewall of the silicon nitride film 64 and the end of the trench 62 for forming element isolating regions is changed on a MOS transistor basis. This will be explained in detail in comparison with a case where the processes of FIGS. 8 and 9 are eliminated. FIGS. 22 to 28 are sectional views showing schematically a manufacturing method in a case where the processes of FIGS. 8 and 9 are omitted in the manufacturing method of the first embodiment.

First, after the structure shown in FIG. 7 is obtained, the trenches 62 are filled with the silicon oxide film 65, thereby forming the element isolating regions STI1 to STI3. As a result, the structure shown in FIG. 22 is obtained. Next, the silicon nitride film 61 and pad oxide film 60 are removed. As described in FIG. 13, when the pad oxide film 60 is removed, the upper parts of the element isolating regions STI1 to STI3 are also etched. The amount of etching of the element isolating regions STI1 to STI3 is the same in the FHV region, FLV region, and LV region. Accordingly, even after the pad oxide film 60 is removed, the shapes of the element isolating regions STI1 to STI3 are the same in the respective regions as shown in FIG. 23.

Figure 24:
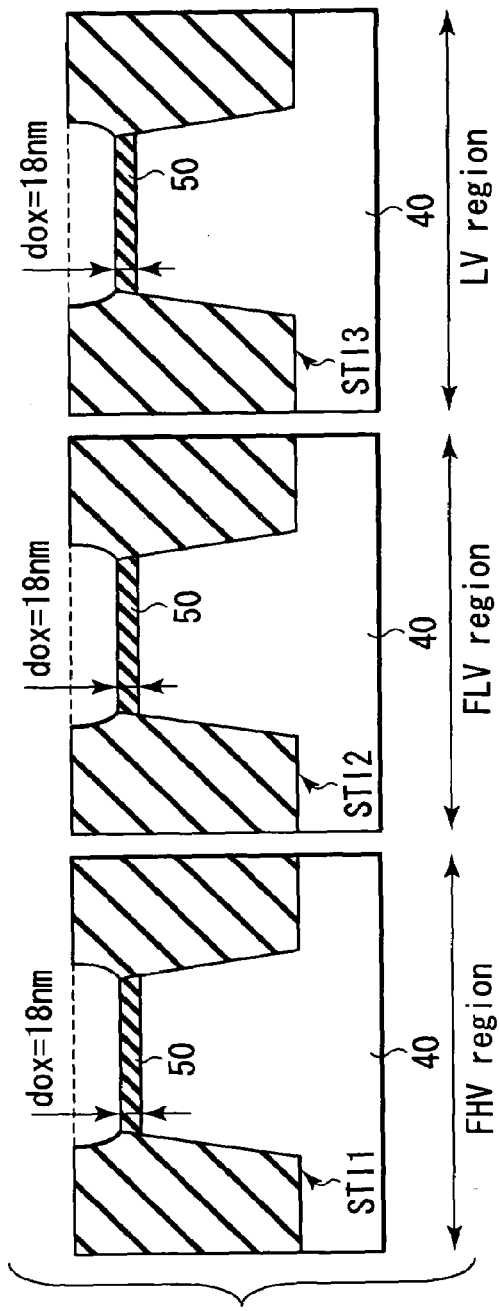
Figure 25:
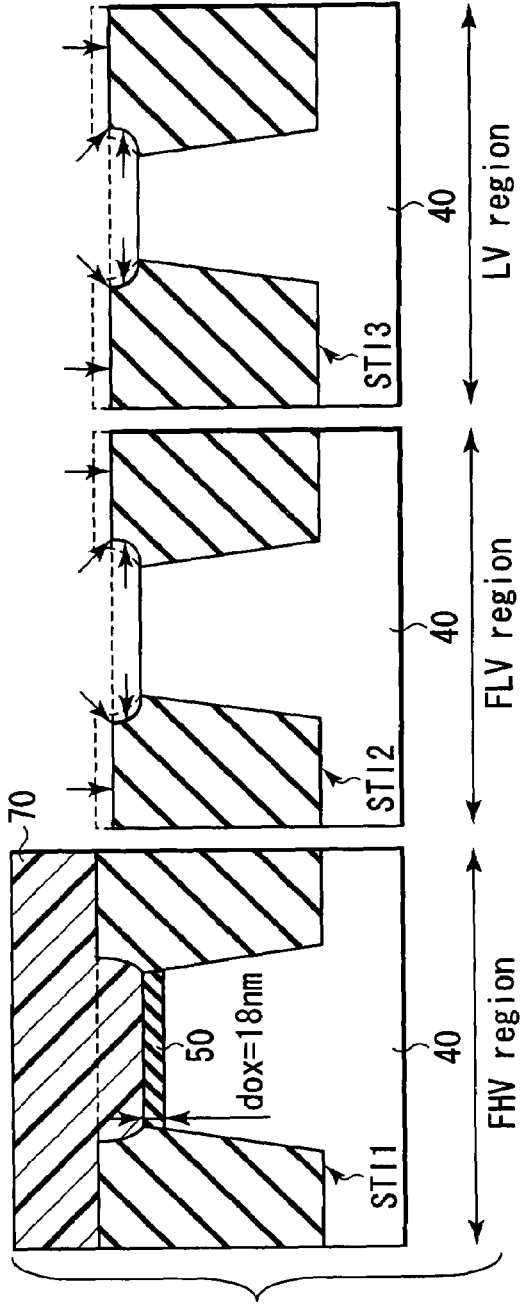

Next, as shown in FIG. 24, a gate insulating film 50 with a film thickness of 18 nm is formed. Then, as shown in FIG. 25, with the FHV region protected, the gate insulating film 50 in the FLV region and LV region is removed. At this time, in the FLV region and LV region, not only the gate insulating film 50 but also the upper parts of the element isolating regions STI2, STI3 are etched. As a result, the element isolating region STI1 differs from the element isolating regions STI2, STI3 in shape. More specifically, in the element isolating regions STI2, STI3, the region projecting from the surface of the semiconductor substrate 40 is smaller than that in the element isolating region STI1.

Next, as shown in FIG. 26, a gate insulating film 51 with a film thickness of 8 nm is formed. Then, as shown in FIG. 27, with the FHV region and FLV region protected, the gate insulating film in the LV region is removed. At this time, in the LV region, not only the gate insulating film 51 but also the upper part of the element isolating region STI3 is etched. Thus, in the element isolating region STI3, the region projecting from the surface of the semiconductor substrate 40 becomes still smaller. Thereafter, as shown in FIG. 28, a gate insulating film 52 with a film thickness of 3 nm is formed in the LV region.

The sectional structures of the MOS transistors having different gate insulating film thicknesses formed as described above are as shown in FIG. 29. Specifically, the distance from the position where the gate insulating film 50 contacts each of the element isolating regions STI1 to STI3 to the top surface end of each of the element isolating regions STI1 to STI3 becomes larger as the gate insulating film thickness becomes smaller. That is, if the distance from the position where the gate insulating film 50 contacts the element isolating region STI1 to the top surface end of the element isolating region STI1 is d100, the distance from the position where the gate insulating film 51 contacts the element isolating region STI2 to the top surface end of the element isolating region STI2 is d110, and the distance from the position where the gate insulating film 52 contacts the element isolating region STI3 to the top surface end of the element isolating region STI3 is d120, the expression d100<d110<d120 holds. The top corners of the element isolating regions STI2, STI3 are etched deeply, with the result that the lowest position of the gate electrode 53 is lower than the top surface of the gate insulating film in the FLV region and LV region. The degree of the level difference becomes larger as the gate insulating film thickness becomes smaller. That is, if the difference between the top surface of the gate insulating film 51 and the lowest part of the gate electrode 53 is d130 and the difference between the top surface of the gate insulating film 52 and the lowest part of the gate electrode 53 is d140, the expression d130<d140 holds.

As described above, in the method explained in FIGS. 22 to 28, the number of times the element isolating region STI1 is etched after the process of FIG. 22 is only once (the process of etching the pad oxide film 60). In contrast, the number of times the element isolating region STI2 is etched after the process of FIG. 22 is twice (the process of etching the pad oxide film 60 and the process of etching the gate insulating film 50). In addition, the number of times the element isolating region STI3 is etched after the process of FIG. 22 is three times (the process of etching the pad oxide film 60 and the processes of etching the gate insulating films 50, 51). That is, as the process of forming a gate insulating film is carried out later in the order of processes, the number of times the element isolating region in the relevant region is etched increases. As a result, the corners of the element isolating region are particularly etched deeply. Thus, the shape of the gate electrode of the MOS transistor differs from one region to another. Consequently, the MOS transistors differing in the film thickness of the gate insulating film might differ in their characteristics, which might make the reliability of the operation of the flash memory unstable.

In the processes according to the first embodiment, the element isolating regions STI2, STI3 in the regions where a gate insulating film is formed later in the order of processes are formed, taking into account the process of removing a gate insulating film. Specifically, in the processes of FIGS. 8 and 9, in a region where a gate insulating film is formed later in the order of processes, the amount of etching of the silicon nitride film 61 is made larger. In other words, it can be said that, in a region where a gate insulating film is formed later in the order of processes, the amount of protrusion of the element isolating regions STI1, STI2, STI3 into the element region is made larger. As shown in FIG. 12, in the FHV region where a gate insulating is formed first, the element isolating region STI1 does not project onto element region AA1. However, in the FLV region where a gate insulating film is formed second, the element isolating region STI2 projects onto the element region AA2 by a width d7. Moreover, in the LV region where a gate insulating film is formed last, the element isolating region STI3 projects onto the element region AA3 by a width d8 (>d7). The width d7 corresponds to the amount of the element isolating region STI2 to be etched at the step of etching the gate insulating film 50 in FIG. 16. In addition, the width d8 corresponds to the amount of the element isolating region STI3 to be etched at the step of etching the gate insulating film 50 in FIG. 16 and the step of etching the gate insulating film 51 in FIG. 19.

Therefore, when the gate insulating film 50 is removed in the process explained in FIG. 16, the width from the face where the surface of the semiconductor substrate 40 contacts the element isolating region STI2 to the top surface end of the element isolating region STI2 is equal to the width from the face where the gate insulating film 50 contacts the element isolating region STI1 to the top surface end of the element isolating region STI1. In addition, when the gate insulating film 50 is removed in FIG. 16 and the gate insulating film 51 is removed in FIG. 19, the width from the face where the surface of the semiconductor substrate 40 contacts the element isolating region STI3 to the top surface end of the element isolating region STI3 is equal to the width from the face where the gate insulating film 50 contacts the element isolating region STI1 to the top surface end of the element isolating region STI1.

As described above, the element isolating regions in the FLV region and LV regions are subjected to more etching processes than in the FHV region. However, leaving an etching margin in each of the element isolating regions enables the shapes of the corners of the element isolating regions to be equalized in all of the regions. As a result, the shapes of the gate electrodes of the MOS transistors formed in the FHV region, FLV region, and LV region can be formed as designed, which improves the reliability of the operation of the flash memory.

FIGS. 30 to 35 are sectional views showing sequentially the processes of manufacturing a flash memory according to a first modification of the first embodiment. The first modification is such that the side face of the upper part of each of the element isolating regions STI1 to STI3 is formed so as to be positioned in the same plane as the end of the gate insulating film.

First, the structure of FIG. 7 is obtained. Next, as shown in FIG. 30, the sidewall of the silicon nitride film 61 in each of the FHV region, FLV region, and LV region is etched. At this time, the amount of etching of the silicon nitride film 61 is equal to the amount of etching of the element isolating region STI1 etched at the same time when the pad oxide film 60 explained in FIGS. 12 and 13 is removed.

Figure 31:
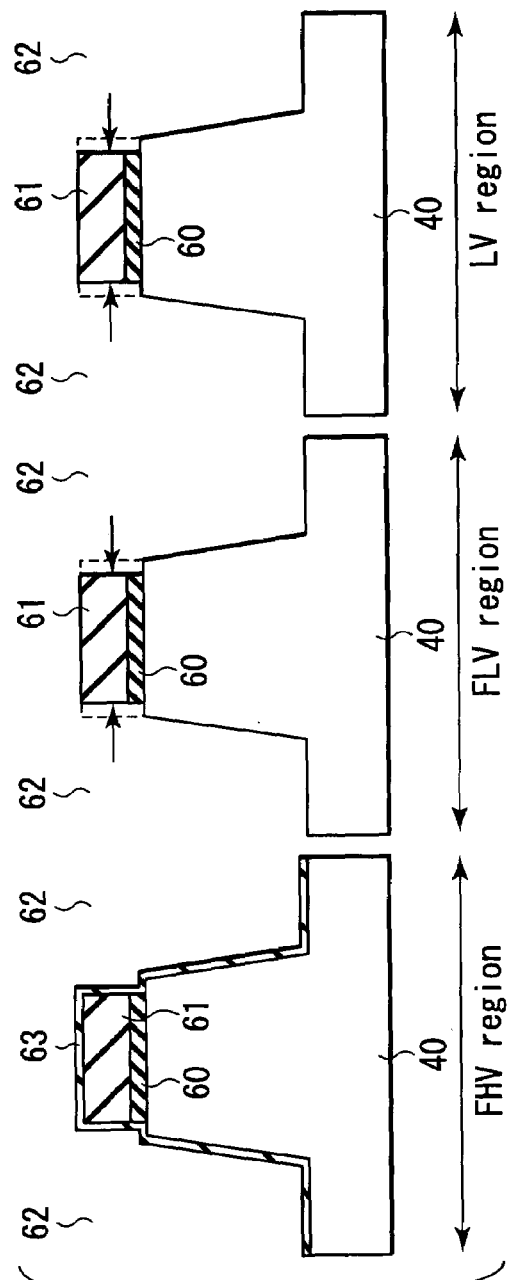

Thereafter, the same processes as those in the first embodiment are carried out. Specifically, as shown in FIG. 31, the FHV region is protected by the silicon oxide film 63. In this state, the sidewall of the silicon nitride film 61 in each of the FLV region and LV region is etched. At this time, the amount of etching of the silicon nitride film 61 is equal to the amount of etching of the element isolating region STI2 etched at the same time when the gate insulating film 50 is removed.

Figure 32:
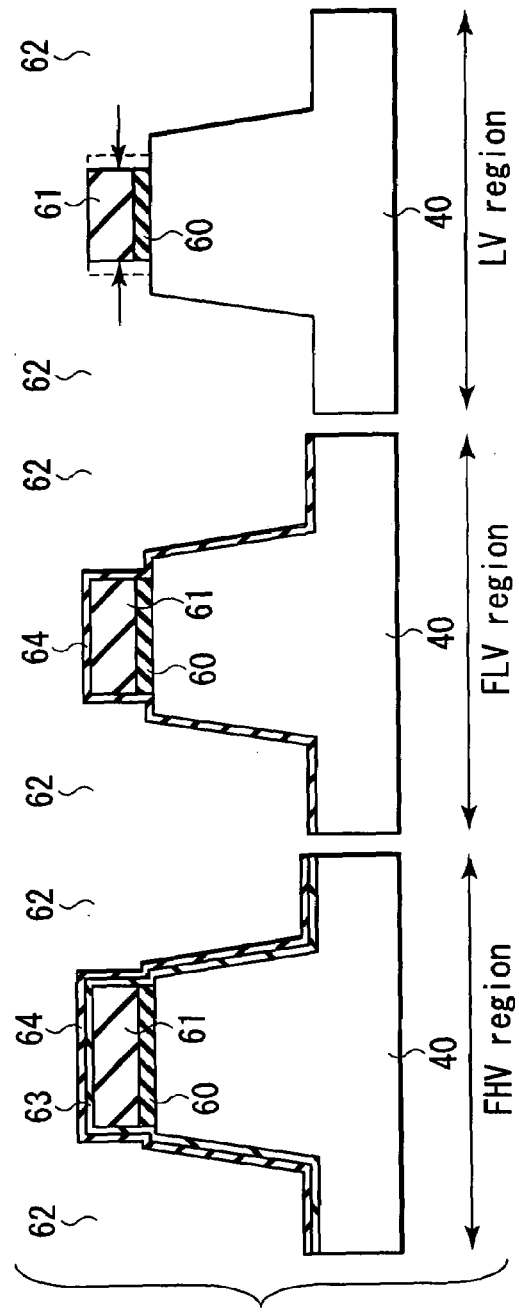

Next, as shown in FIG. 32, the FHV region and FLV region are protected by the silicon oxide film 64. In this state, the sidewall of the silicon nitride film 61 in the LV region is etched. At this time, the amount of etching of the silicon nitride film 61 is equal to the amount of etching of the element isolating region STI3 etched at the same time when the gate insulating film 51 is removed.

Next, the trench 62 is filled with the silicon oxide film 65. The silicon oxide film 65 is then flattened by CMP techniques using the silicon nitride film 61 as a stopper. Thereafter, the silicon nitride film 61 is removed. As a result, element isolating regions STI1 to STI3 as shown in FIG. 33 are completed. A part of the upper part of the element isolating region STI1 is located on the element region AA1 and has an overlap width of d9. A part of the upper part of the element isolating region STI2 is located on the element region AA2 and has an overlap width of d10 (>d9). In addition, a part of the upper part of the element isolating region STI3 is located on the element region AA3 and has an overlap width of d11 (>d10).

Next, as shown in FIG. 34, the pad oxide film 60 is removed. At this time, the upper part of each of the element isolating regions STI1 to STI3 is etched at the same time. As a result, the side face of the upper part of the element isolating region STI1 is located in the same plane as the end of the element region AA1. Thereafter, as in the first embodiment, the processes of forming gate insulating films 50 to 51 and the processes of etching the gate insulating films 50, 51 are carried out, thereby forming a structure shown in FIG. 35. That is, the side face of the upper part of each of the element isolating regions STI1 to STI2 is located in the same plane as the end of each of the element regions AA1 to AA3.

Figure 36:
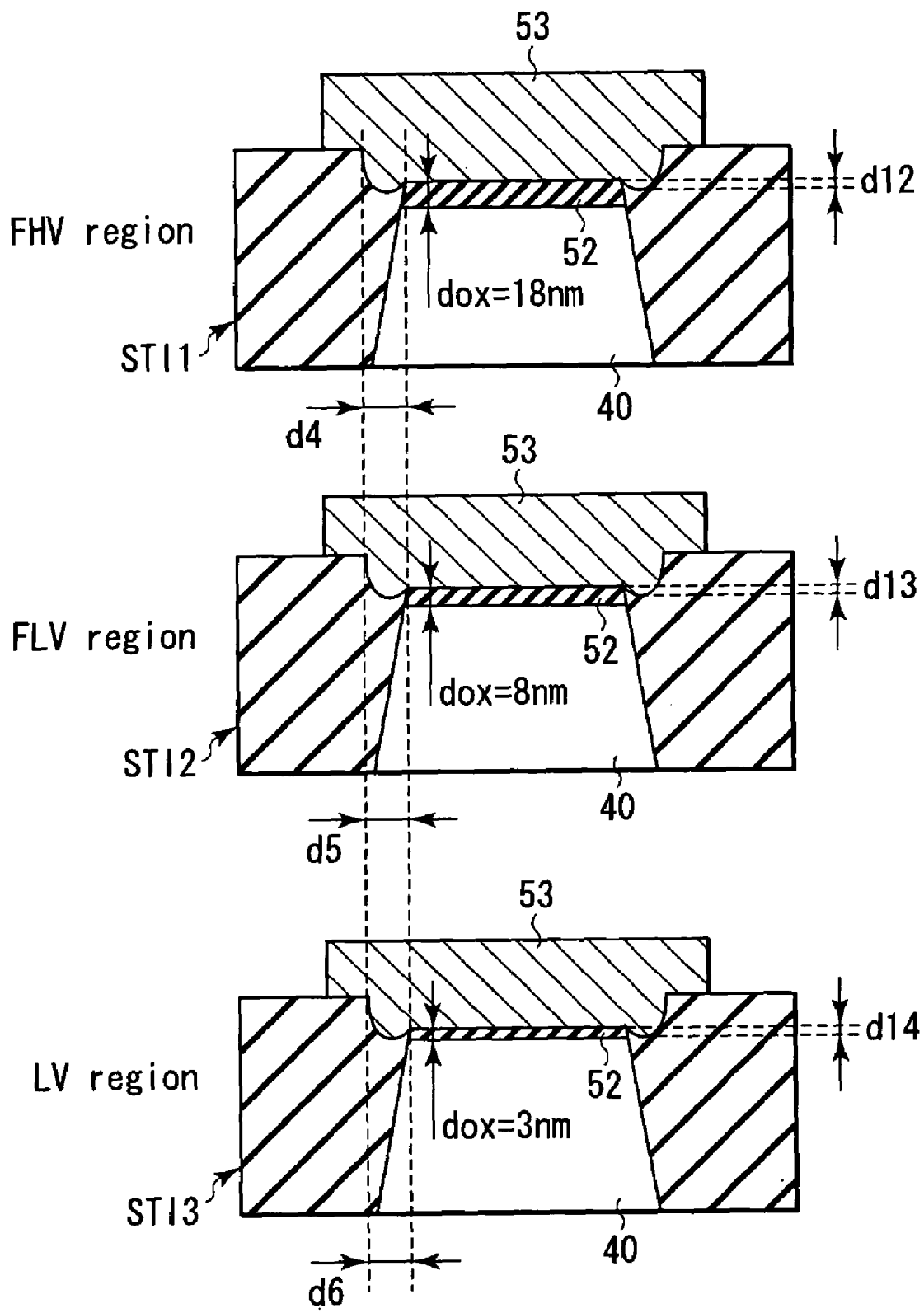
FIG. 36 is a sectional view of the select gate decoder included in a flash memory according a second modification of the first embodiment.

FIG. 36 is a sectional view of a flash memory according to a second modification of the first embodiment, particularly a sectional view of each of the FHV region, FLV region, and LV region. As shown in FIG. 36, a part of the gate electrode 53 may be in a position lower than the surface of each of the gate insulating films 50 to 52. This structure is obtained when the pad oxide film 60 is thick or when etching is done excessively in the manufacturing method explained in the first embodiment. Even in such a case, the equation d4=d5=d6 explained in FIG. 4 holds. In addition, the differences (d12 to d14) between the gate insulating films 50 to 52 and the bottom of the gate electrode 53 are all the same. Even when the bottom of the gate electrode 53 is lower than the surface of each of the gate insulating films 50 to 52 as in the configuration, since the degree of difference is the same among the regions, the occurrence of variations in the characteristics of the MOS transistors can be suppressed.

Figures 35, 37:
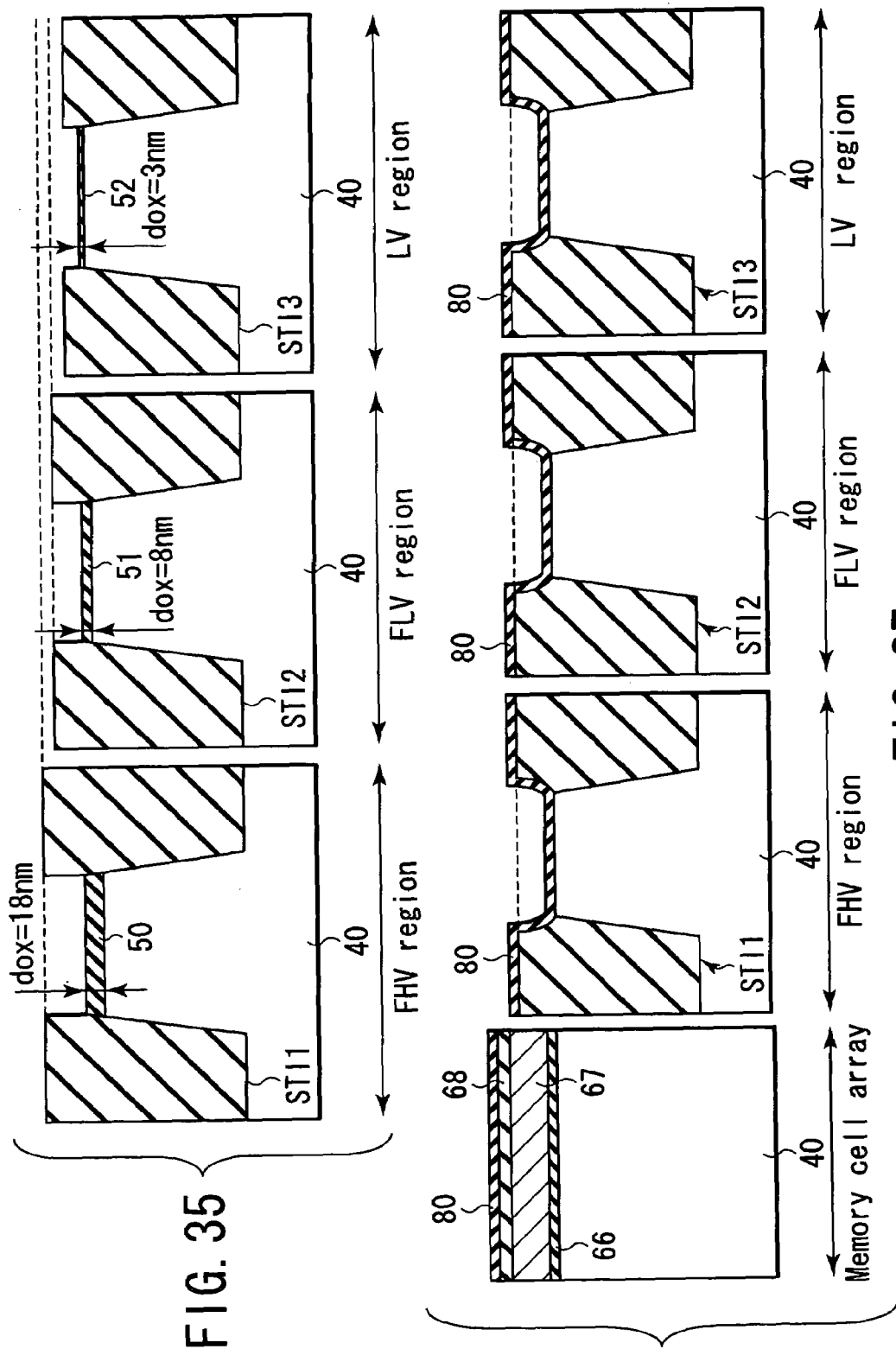
Figure 44:
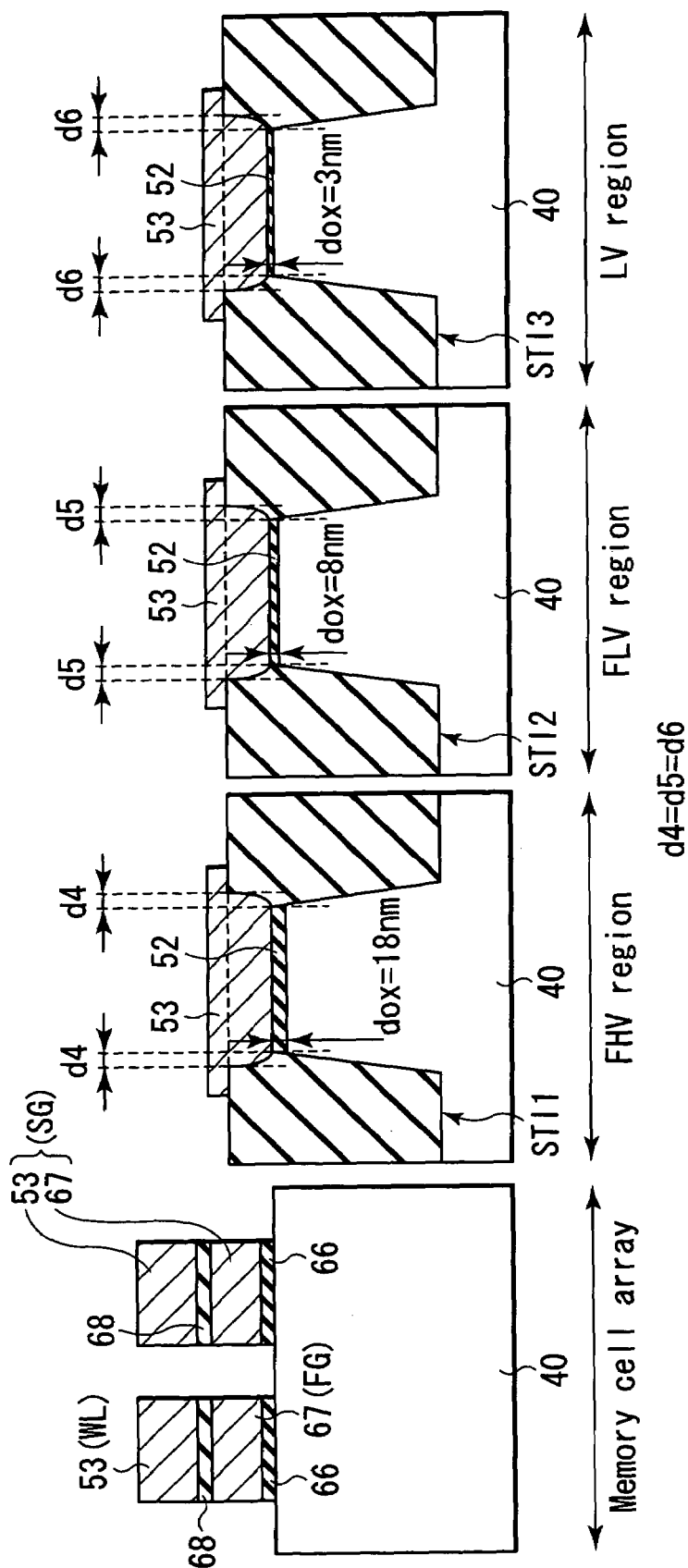

Hereinafter, a semiconductor memory device according to a second embodiment of the present invention and a method of manufacturing the semiconductor memory device will be explained. The second embodiment is such that a mask material is used instead of forming the element isolating regions in the first embodiment, taking the amount of etching into account, thereby preventing the element isolating regions from being etched. Since the block configuration and operation of a flash memory according to the second embodiment are the same as in the first embodiment, explanation will be omitted. A method of manufacturing a flash memory will be explained, centering on a select gate decoder 15. FIGS. 37 to 44 are sectional views showing sequentially the processes of manufacturing a flash memory according to the second embodiment. FIGS. 38 to 43 show only the FHV region, FLV region, and LV region. FIGS. 37 and 44 further show the memory cell array region.

First, by the process explained in the first embodiment, the structure shown in FIG. 23 is obtained. Next, in the memory cell array region, a gate insulating film 66, a polysilicon layer 67, and an inter-gate insulating film 68 for each of the memory cell transistor MT and select transistor ST are formed. Although the gate insulating film 66, polysilicon layer 67, and inter-gate insulating film 68 are also formed in the FHV region, FLV region, and LV region, all of the layers in these regions are removed.

Next, as shown in FIG. 37, for example, a silicon nitride film 80 is formed on the memory cell array region, FHV region, FLV region, and LV region by CVD techniques. The gate insulating film 66, polysilicon layer 67, and inter-gate insulating film in the memory cell array region are completely covered with the silicon nitride film 80. Thereafter, in the FHV region, FLV region, and LV region, an ion implantation process for control of the threshold values of MOS transistors and the formation of well regions is carried out. In the ion implantation process, the regions into which impurities need not be introduced are covered with photoresist. At this time, since the memory cell array region has been protected by the silicon nitride film 80, damage to the memory cell array region is suppressed in the photoresist applying process and the photoresist removing process.

Figure 38:
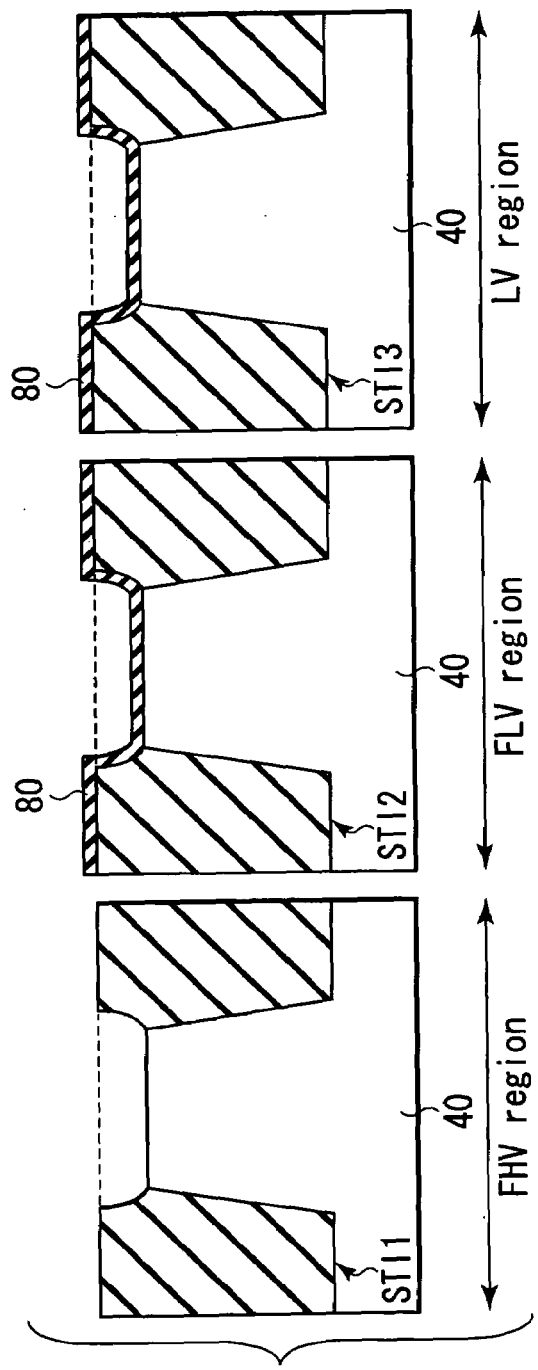

Next, as shown in FIG. 38, to form a gate insulating film in the FHV region, the silicon nitride film 80 in the FHV region is removed by photolithographic techniques and etching. That is, photoresist is applied to the semiconductor substrate. Next, by photolithographic techniques, the photoresist in the FHV region is removed, thereby exposing the silicon nitride film 80 in the FHV region. Then, by wet etching using, for example, $H_3PO_4$, the silicon nitride film 80 in the FHV region is removed.

Figure 39:
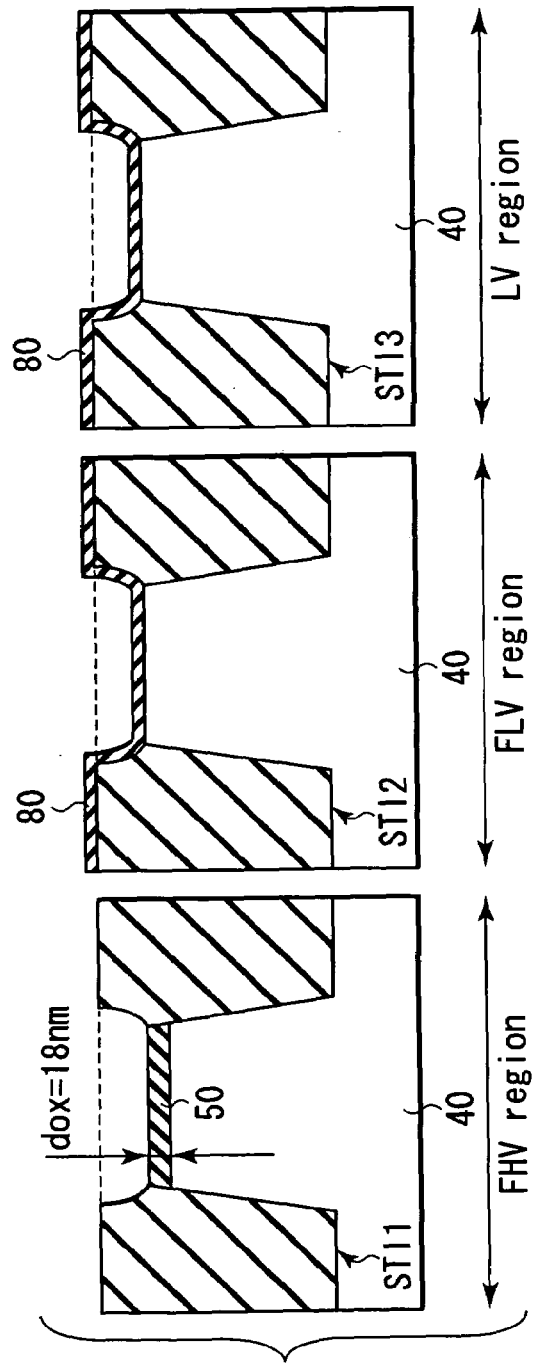

Next, as shown in FIG. 39, on the semiconductor substrate 40 in the FHV region, an 18-nm-thick gate insulating film 50 is formed by, for example, thermal oxidation techniques. At this time, since the memory cell array region, FLV region, and LV region are protected by the silicon nitride film 80, the gate insulating film 50 is not formed in these regions.

Figure 40:
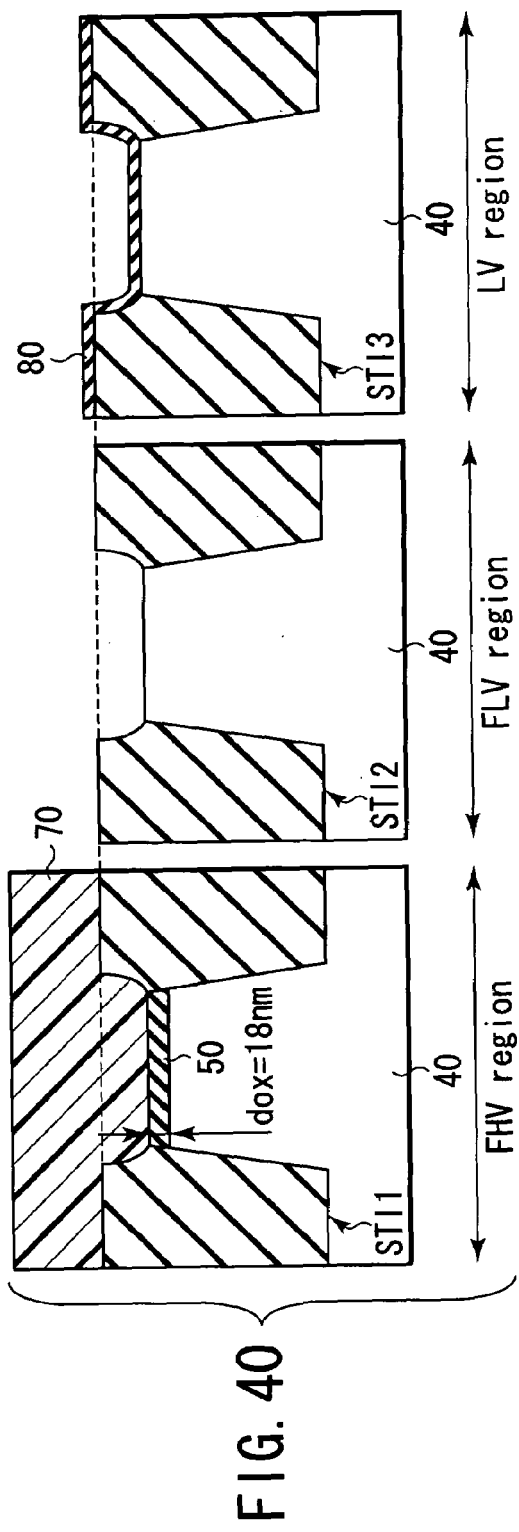
Figure 41:
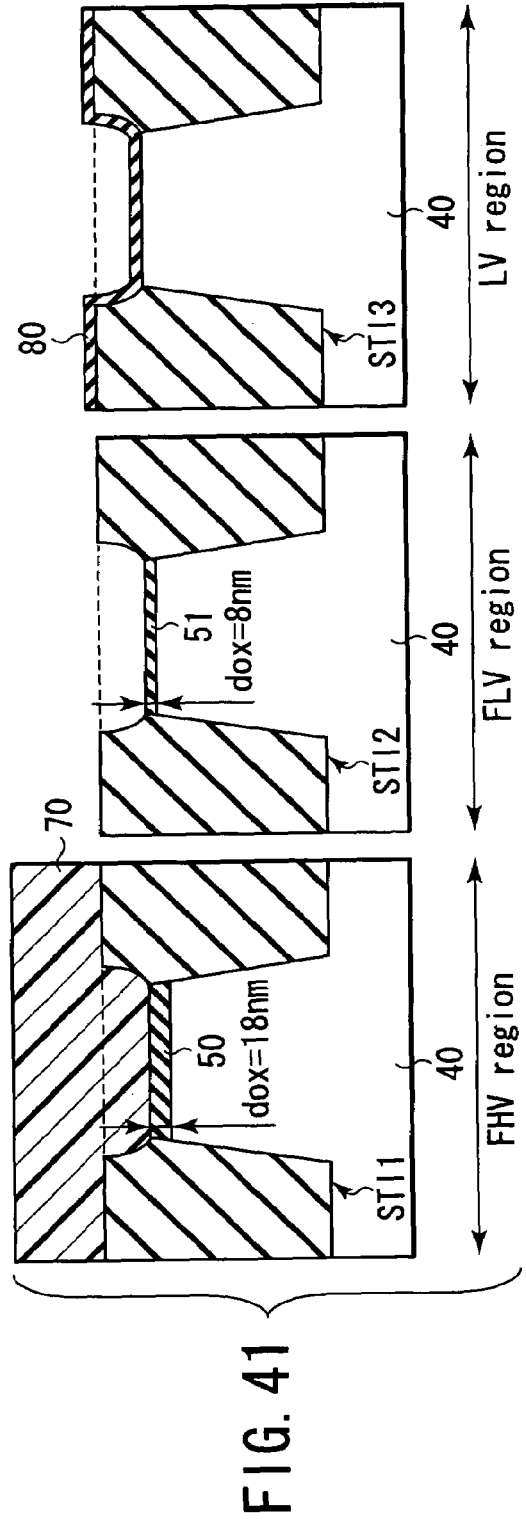

Next, as shown in FIG. 40, the silicon nitride film 80 in the FLV region is removed and photoresist 70 is formed on the FHV region. Then, as shown in FIG. 41, on the semiconductor substrate 40 in the FLV region, an 8-nm-thick gate insulating film 51 is formed by, for example, thermal oxidation techniques. At this time, since the FHV region is protected by the photoresist 70 and the memory cell array region and LV region are protected by the silicon nitride film 80, the gate insulating film 51 is not formed in these regions.

Figures 42, 43:
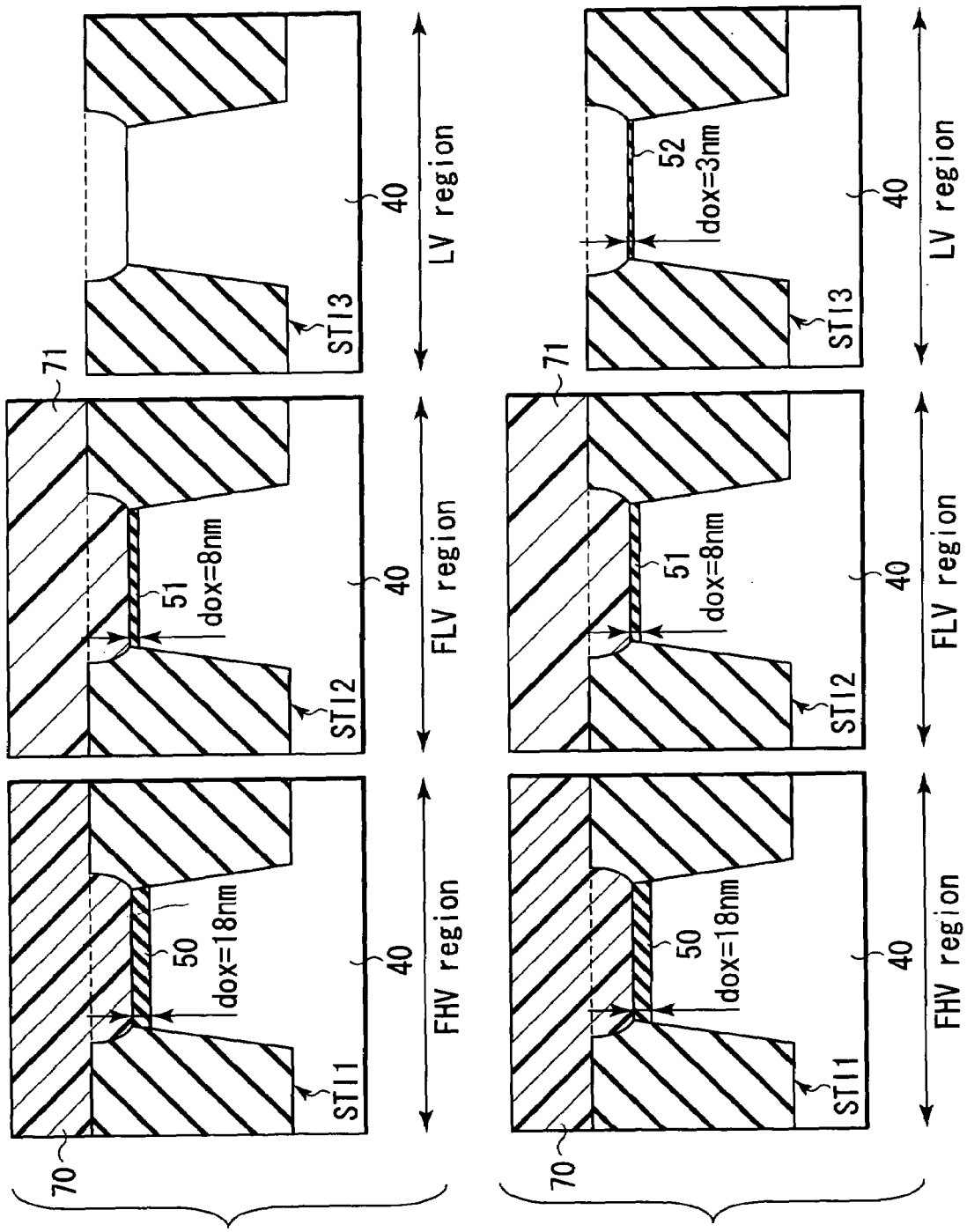

Next, as shown in FIG. 42, the silicon nitride film 80 in the LV region is removed and photoresist 71 is formed on the FLV region. Then, as shown in FIG. 43, on the semiconductor substrate 40 in the LV region, a 3-nm-thick gate insulating film 52 is formed by, for example, thermal oxidation techniques. At this time, since the FHV region and FLV region are protected by the photoresists 70, 71 and the memory cell array region is protected by the silicon nitride film 80, the gate insulating film 52 is not formed in these regions.

By the above processes, the gate insulating films 50 to 52 of the MOS transistors are completed in the FHV region, FLV region, and LV region. Thereafter, a polysilicon layer 53 is formed in the memory cell array, FHV region, FLV region, and LV region. Then, as shown in FIG. 44, in the memory cell array region, the polysilicon layer 53, inter-gate insulating film 68, and polysilicon layer 67 are patterned into gate electrode patterns for the memory cell transistor MT and select transistor ST. In the FHV region, FLV region, and LV region, too, the polysilicon layer 53 is patterned into gate electrode patterns for the MOS transistors.

As described above, in the flash memory of the second embodiment, when a gate insulating film with a certain thickness is formed, a region where a gate insulating film with another film thickness is to be formed is protected by photoresist or a silicon nitride film. Thus, differently from the first embodiment, the region formed second, third, or later in the order of forming a gate insulating film will not be exposed to the processes of etching gate insulating films with different film thicknesses. That is, the number of times the element isolating regions STI1 to STI3 formed in the respective regions are etched is the same. Thus, the shapes of the element isolating regions STI1 to STI3 are the same. As a result, as in the first embodiment, the distance from the position where the element isolating region contacts the gate insulating film to the top surface end of the element isolating region can be made equal in a plurality of MOS transistors having different gate insulating film thicknesses (in FIG. 44, d4=d5=d6). In other words, the position of the end of the element isolating region and the shape of the gate electrode can be made equal among a plurality of MOS transistors having different gate insulating film thicknesses. Thus, the characteristics of the MOS transistors can be made equal, which improves the reliability of the flash memory. For the above reason, the position of the top surface of each of the element isolating regions STI1 to STI3 is equal, which is different from the first embodiment.

FIGS. 45 to 48 are sectional views showing sequentially the processes of manufacturing a flash memory according to a modification of the second embodiment. The first modification is such that the side face of the upper part of each of the element isolating regions STI1 to STI3 is formed so as to be in the same plane as the end of the gate insulating film.

Figure 45:
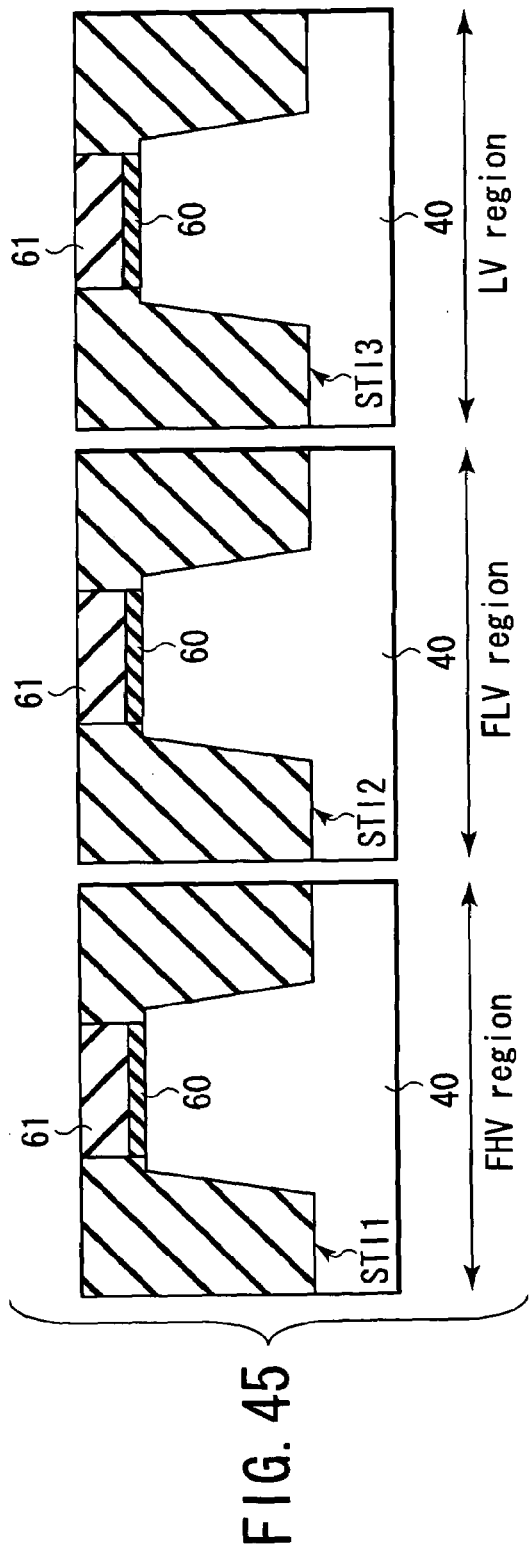
Figure 46:
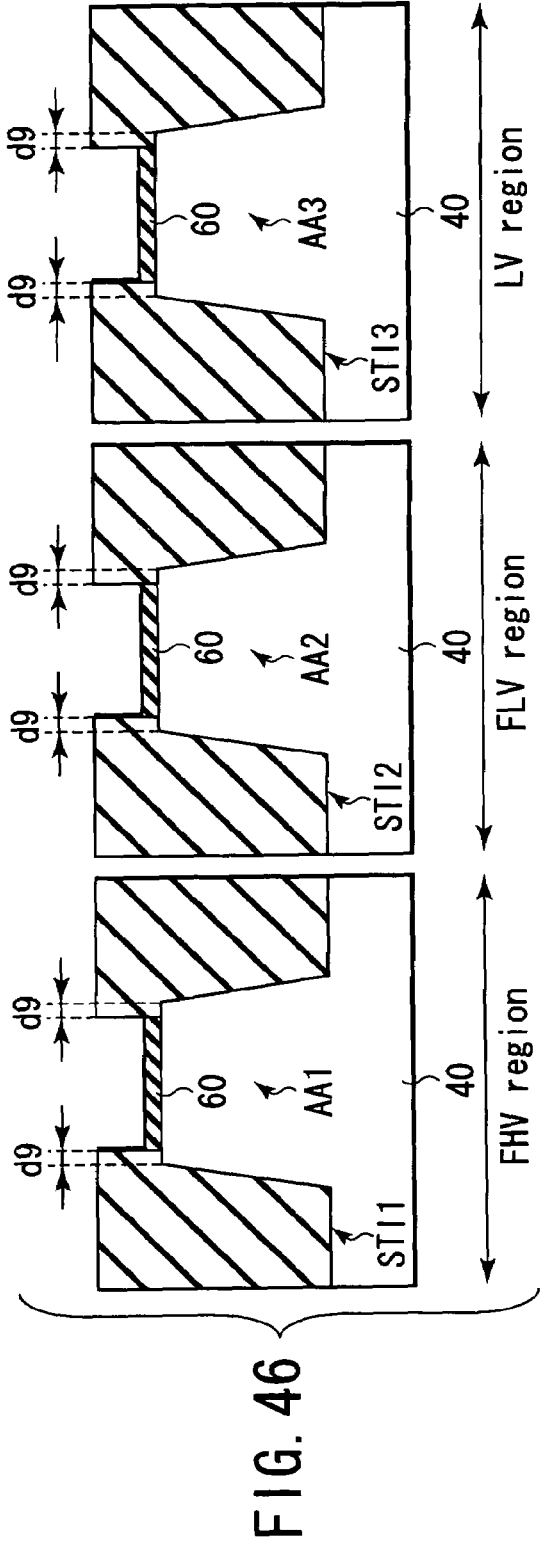

First, by the process explained in the first modification of the first embodiment, the configuration of FIG. 30 is obtained. Next, as shown in FIG. 45, the trenches 62 are filled with the silicon oxide film 65, thereby forming element isolating regions STI1 to STI3. Then, the silicon nitride film 61 is removed. As shown in the FIG. 46, part of the element isolating regions STI1 to STI3 are located on the element regions AA1 to AA3, respectively, and all have a width of d9. The amount of overlap with each of the element regions AA1 to AA3 is equal in all of the regions. The width d9 corresponds to the amount of etching of the element isolating regions STI1 to STI3 etched at the same time when the pad oxide film 60 is etched later.

As shown in FIG. 47, the pad oxide film 60 is etched away. As a result, the sidewalls of the upper parts of the element isolating regions STI1 to STI3 are located in the same plane as the ends of the element regions AA1 to AA3. Thereafter, by the processes explained in the second embodiment, gate insulating films 50 to 52 are formed, thereby producing the configuration of FIG. 48.

As described above, in the nonvolatile semiconductor memory device according to each of the first and second embodiments and the method of manufacturing the nonvolatile semiconductor memory device, the distances from the positions where the gate insulating films 50 to 52 contact the element isolating regions STI1 to STI3 respectively to the top surface ends of the element isolating regions STI1 to STI3 are all made equal. In other words, the shape of the region where the corners of the element isolating region contact the gate electrode is made equal among the MOS transistors having gate insulating films of different film thicknesses. Still in other words, the structure of the gate electrode can be made equal among the MOS transistors having gate insulating films of different film thicknesses. Thus, variations in the characteristics of the MOS transistors having different gate insulating films are minimized, which improves the reliability of the operation of the flash memory.

The above embodiments produce a remarkable effect when the difference in film thickness between the gate insulating film with the largest film thickness and the gate insulating film with the smallest film thickness is about 100 nm or more.

Figure 49:
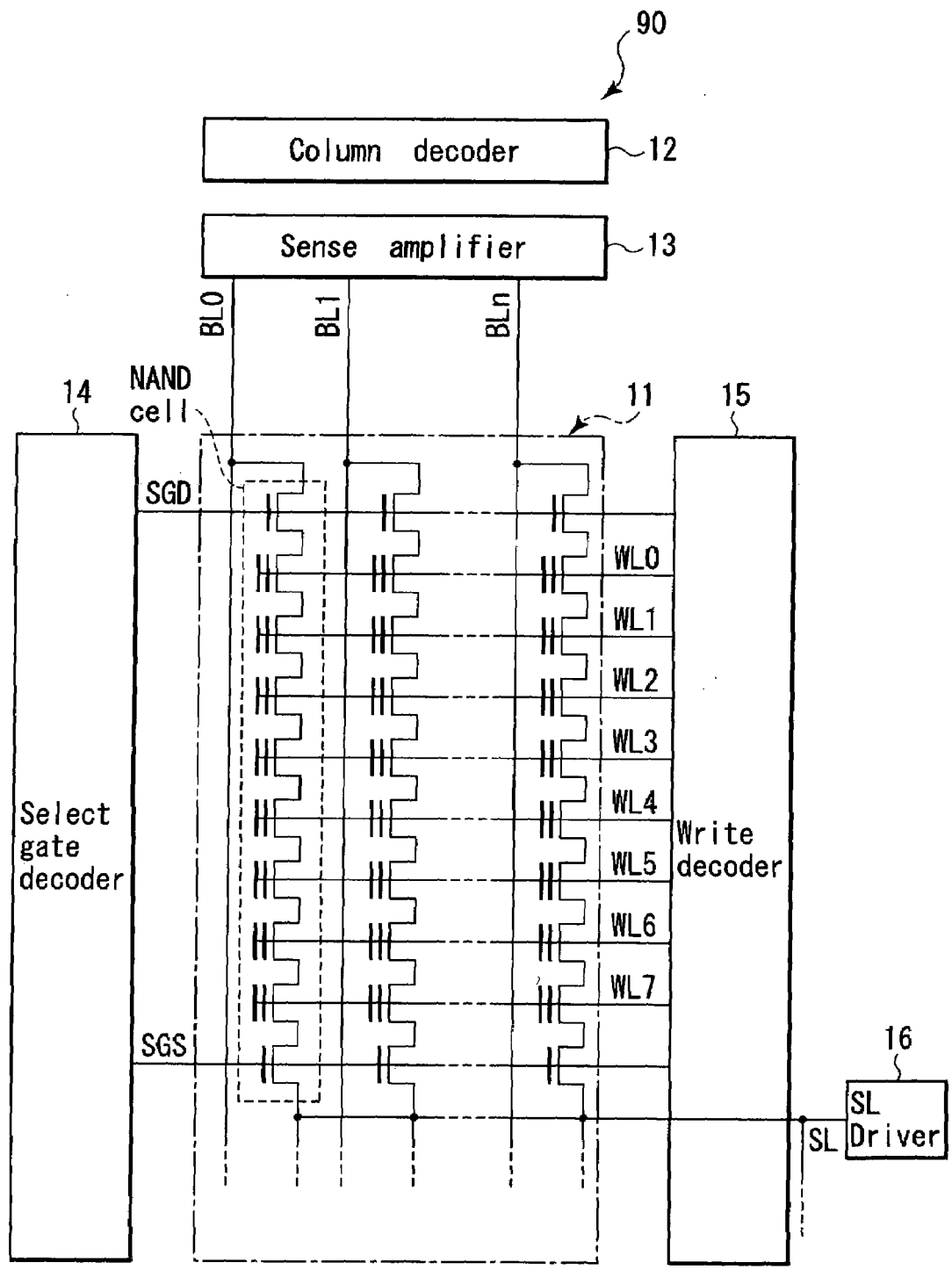
FIG. 49 is a block diagram of a flash memory according to a first modification of each of the first and second embodiments.

In the first and second embodiments, the flash memory has memory cells each of which includes two transistors, a select transistor ST, and a memory cell transistor MT. The embodiments may be applied to a NAND flash memory. FIG. 49 is a block diagram of a flash memory according to a first modification of each of the first and second embodiments. FIG. 49 shows a NAND flash memory.

As shown in FIG. 49, a memory cell array 90 has a plurality of NAND cells. A NAND cell has two select transistors ST1, ST2 and a plurality of memory cell transistors MTs. Although the number of memory cell transistors is eight in FIG. 49, it is not limited to eight. For instance, the number of memory cell transistors may be 16 or 32. A plurality of memory cell transistors MTs are connected in series between the source of the select transistor ST1 and the drain of the select transistor ST2. The drain regions of the select transistors ST1 in a same column are connected commonly to a bit line and the source regions of the select transistors ST2 in the column are connected commonly to a source line. Each of the memory cell transistor MT and select transistors ST1, ST2 has a stacked gate formed on a semiconductor substrate with a gate insulating film interposed therebetween. The stacked gate includes a floating gate formed on the gate insulating film and a control gate formed on the floating gate with an inter-gate insulating film interposed therebetween. In the memory cell transistors MTs, the floating gates are separated on a transistor basis. In the select transistors ST1, ST2, the floating gates adjoining in the word line direction are connected to each other. Moreover, in each of the select transistors ST1, ST2, the floating gate and the control gate are connected to each other electrically. The control gates of the memory cell transistors MTs in a same row are connected commonly to a word line. The control gates of the select transistors ST1, ST2 in a same row are connected commonly to select gate lines SGD, SGS, respectively. The remaining configuration is the same as that of each of the first and second embodiments.

The first and second embodiments can be applied to even the above NAND flash memory.

Figure 50:
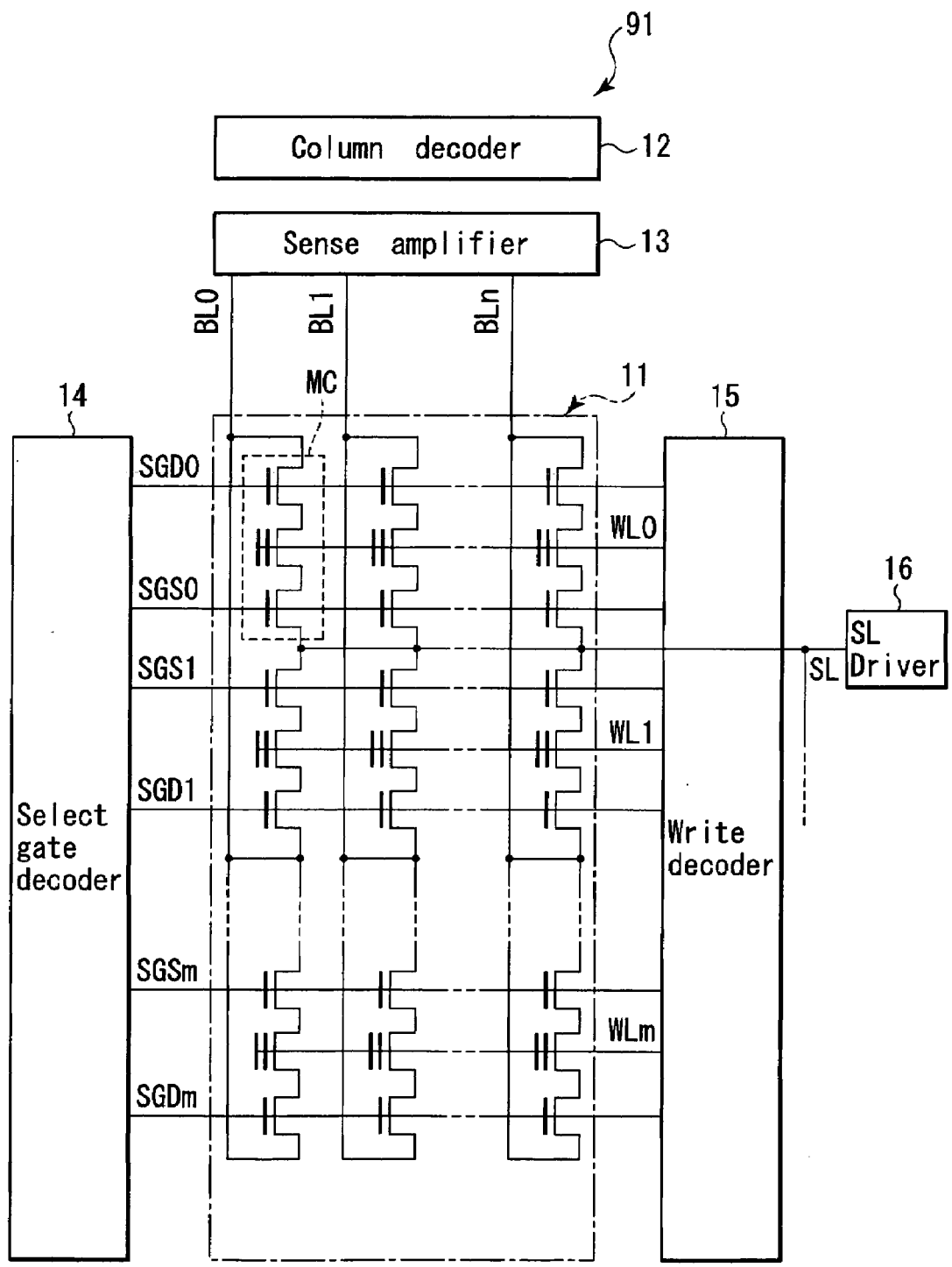
FIG. 50 is a block diagram of a flash memory according to a second modification of each of the first and second embodiments.

Furthermore, the above embodiments can be applied to a flash memory that has memory cells each of which includes two select transistors ST1, ST2 and a memory transistor MT. FIG. 50 is a block diagram of a flash memory according to a second modification of each of the first and second embodiments.

As shown in FIG. 50, a memory cell array 91 has a plurality of memory cells MCs arranged in a matrix. A memory cell has two select transistors ST1, ST2 and a memory transistor MT. These three transistors are connected in series in such a manner that the two select transistors ST1, ST2 sandwich the memory cell transistor MT between them. The drain regions of the select transistors ST1 in a same column are connected commonly to a bit line. The source regions of the select transistors ST2 in the column are connected commonly to a source line. Each of the memory cell transistor MT and select transistors ST1, ST2 has a stacked gate formed on a semiconductor substrate with a gate insulating film interposed therebetween. The stacked gate includes a floating gate formed on the gate insulating film and a control gate formed on the floating gate with an inter-gate insulating film interposed therebetween. In the memory cell transistors MTs, the floating gates are separated on a transistor basis. In the select transistors ST1, ST2, the floating gates adjoining in the word line direction are connected to each other. Moreover, in each of the select transistors ST1, ST2, the floating gate and the control gate are connected to each other electrically. The control gates of the memory cell transistors MTs in a same row are connected commonly to a word line. The control gates of the select transistors ST1, ST2 in a same row are connected commonly to select gate lines SGD, SGS, respectively. The remaining configuration is the same as that of each of the first and second embodiments.

The first and second embodiments can be applied to even the above-described flash memory.

Figure 51:
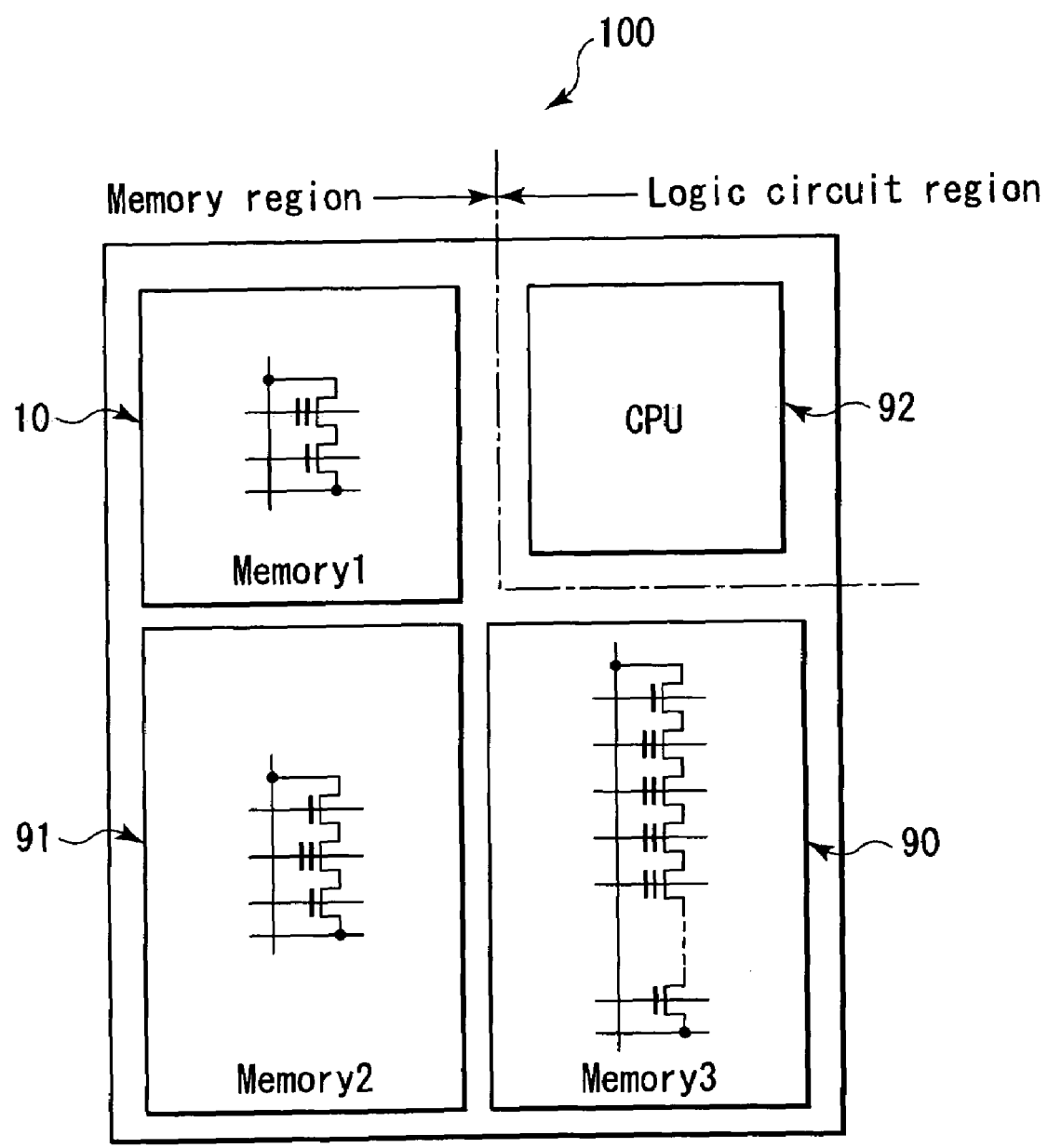
FIG. 51 is a block diagram of a system LSI including a flash memory according to a third modification of each of the first and second embodiments.

Furthermore, the first and second embodiments can be applied to a system LSI. FIG. 51 is a block diagram of a system LSI according to a third modification of each of the first and second embodiments.

As shown in FIG. 51, a system LSI 100 has a logic circuit area and a memory area. In the logic circuit area, for example, a CPU 92 is provided. In the memory area, there are provided a flash memory 10 explained in the first and second embodiments, a flash memory 91 including three MOS transistors explained in FIG. 50, and a NAND flash memory 90 explained in FIG. 49. Each of the memory cells in the flash memory 10 has two transistors connected in series, which provides a higher current driving capability than that of the other memory cells. Therefore, the flash memory 10 is suitable for high-speed reading. As shown in FIG. 51, when the flash memory 10 is embedded on the same chip as the CPU 92, the flash memory 10 can be used as a ROM for storing firmware or the like for the CPU 92. Since the operating speed of the flash memory 10 is fast, the CPU 92 can read data directly without using a RAM or the like, which makes a RAM unnecessary and therefore improves the operating speed of the system LSI. The flash memory 10 can be formed in the same manufacturing processes as those of the flash memory 91 and NAND flash memory 90. For example, the ion implantation process for forming impurity diffused layers and the process of patterning gate electrodes and metal wiring layers can be carried out on three types of flash memories at the same time. In this case, for example, the impurity diffused layers have the same concentration between the individual memories. As described above, since the three flash memories provided in an LSI can be formed in the same processes, the manufacture of LSI can be simplified.

Furthermore, for example, the CPU 92 may be formed on an SOI substrate in the logic circuit area, and each of the memories 10, 90, and 91 may be formed on a bulk silicon substrate in the memory area.

While in the first and second embodiments, the explanation has been given using a select gate decoder as an example, the embodiments are not restricted to the select gate decoder. For instance, the embodiments may be applied to a column decoder. Furthermore, the embodiments may be applied not only to a semiconductor memory device but also to a general semiconductor device having a plurality of MOS transistors differing in gate insulating film thickness.

Additional advantages and modifications will readily occur to those skilled in the art. Therefore, the invention in its broader aspects is not limited to the specific details, representative embodiments shown and described herein. Accordingly, various modifications may be made without departing from the spirit or scope of the general inventive concept as defined by the appended claims and their equivalents.

What is claimed is:

1. A semiconductor memory device comprising:
a first MOS transistor including a first gate electrode which is formed on a first element region enclosed by a first element isolating region formed in a semiconductor substrate with a first gate insulating film interposed between the first element region and the first gate electrode, an end portion of the first gate electrode in the gate width direction being located on the first element isolating region; and
a second MOS transistor including a second gate electrode which is formed on a second element region enclosed by a second element isolating region formed in the semiconductor substrate with a second gate insulating film at least twice as thick as the first gate insulating film interposed between the second element region and the second gate electrode, an end portion of the second gate electrode in the gate width direction being located on the second element isolating region, the upper part of each of the first and second element isolating regions being formed so as to project from the surface of the semiconductor substrate and have their corners curved, and the width from the position where the first element isolating region contacts the first gate insulating film to the top surface end of the first element isolating region being equal to the width from the position where the second element isolating region contacts the second gate insulating film to the top surface end of the second element isolating region.

2. The semiconductor memory device according to claim 1, wherein the underside of a part of the first gate electrode located on the first element isolating region is lower than the top surface of the first gate insulating film;
the underside of a part of the second gate electrode located on the second element isolating region is lower than the top surface of the second gate insulating film; and
the height from the underside of the part of the first gate electrode to the top surface of the first gate insulating film is equal to the height from the underside of the part of the second gate electrode to the top surface of the second gate insulating film.

3. The semiconductor memory device according to claim 1, wherein the top surface of the first element isolating region is lower than the top surface of the second element isolating region.

4. The semiconductor memory device according to claim 3, wherein the difference between the top surface of the first element isolating region and that of the second element isolating region is equal to the width from the position where the first element isolating region contacts the first gate insulating film to the top surface end of the first element isolating region.

5. The semiconductor memory device according to claim 1, wherein the film thickness difference between the first and second gate insulating films is 10 nm or more.

6. The semiconductor memory device according to claim 1, further comprising
memory cells each of which has a third MOS transistor with a stacked gate including a floating gate and a control gate formed on the floating gate with an intergate insulating film interposed therebetween, and a fourth MOS transistor which has a drain connected to the source of the third MOS transistor;
a memory cell array in which the memory cells are arranged in a matrix;
word lines each of which connects commonly to the control gates of the third MOS transistors in a same row;
select gate lines each of which connects commonly to the gates of the fourth MOS transistors in a same row;
a first row decoder which selects any one of the select gate lines in a read operation; and
a second row decoder which selects any one of the word lines and applies a negative potential to the select gate line in a write operation.

7. The semiconductor memory device according to claim 6, wherein the first row decoder includes
row address decode circuits which are provided for the select gate lines in a one-to-one correspondence, and each of which includes the first MOS transistor and decodes a row address signal to produce a row address decode signal;
level shift circuits which are provided for the select gate lines in a one-to-one correspondence and each of which raises the potential of the row address decode signal; and
the second MOS transistors which are provided for the select gate lines in a one-to-one correspondence and each of which has one end of its current path connected to the corresponding select gate line and the other end connected to the corresponding level shift circuit.

8. The semiconductor memory device according to claim 6, further comprising
bit lines each of which connects commonly to the drains of the third MOS transistors in a same row;
source line which connects commonly to the sources of the fourth MOS transistors;
a column decoder which selects any of the bit lines; and
a source line driver which applies a potential to the source line.

9. A semiconductor memory device comprising:
a first MOS transistor including a first gate electrode which is formed on a first element region enclosed by a first element isolating region formed in a semiconductor substrate with a first gate insulating film interposed between the first element region and the first gate electrode, an end portion of the first gate electrode in the gate width direction being located on the first element isolating region; and
a second MOS transistor including a second gate electrode which is formed on a second element region enclosed by a second element isolating region formed in the semiconductor substrate with a second gate insulating film at least twice as thick as the first gate insulating film interposed between the second element region and the second gate electrode, an end portion of the second gate electrode in the gate width direction being located on the second element isolating region, the upper part of each of the first and second element isolating regions being formed so as to project from the surface of the semiconductor substrate, the face where the first element isolating region contacts the first gate insulating film and the side face of the upper part of the first element isolating region being in the same plane, and the face where the second element isolating region contacts the second gate insulating film and the side face of the upper part of the second element isolating region being in the same plane.

10. The semiconductor memory device according to claim 9, wherein the film thickness difference between the first and second gate insulating films is 10 nm or more.

11. The semiconductor memory device according to claim 9, further comprising
memory cells each of which has a third MOS transistor with a stacked gate including a floating gate and a control gate formed on the floating gate with an intergate insulating film interposed therebetween, and a fourth MOS transistor which has a drain connected to the source of the third MOS transistor;
a memory cell array in which the memory cells are arranged in a matrix;
word lines each of which connects commonly to the control gates of the third MOS transistors in a same row;
select gate lines each of which connects commonly to the gates of the fourth MOS transistors in a same row;
a first row decoder which selects any one of the select gate lines in a read operation; and
a second row decoder which selects any one of the word lines and applies a negative potential to the select gate line in a write operation.

12. The semiconductor memory device according to claim 11, wherein the first row decoder includes
row address decode circuits which are provided for the select gate lines in a one-to-one correspondence, and each of which includes the first MOS transistor and decodes a row address signal to produce a row address decode signal;
level shift circuits which are provided for the select gate lines in a one-to-one correspondence and each of which raises the potential of the row address decode signal; and
the second MOS transistors which are provided for the select gate lines in a one-to-one correspondence and each of which has one end of its current path connected to the corresponding select gate line and the other end connected to the corresponding level shift circuit.

13. The semiconductor memory device according to claim 11, further comprising:
bit lines each of which connects commonly to the drains of the third MOS transistors in a same row;
source line which connects commonly to the source of the fourth MOS transistors;
a column decoder which selects any of the bit lines; and
a source line driver which applies a potential to the source line.

* * * * *